United States Patent
Berendsen et al.

(10) Patent No.: US 10,948,825 B2
(45) Date of Patent: Mar. 16, 2021

(54) METHOD FOR REMOVING PHOTOSENSITIVE MATERIAL ON A SUBSTRATE

(71) Applicant: ASML NETHERLANDS B.V., Veldhoven (NL)

(72) Inventors: Christianus Wilhelmus Johannes Berendsen, Eindhoven (NL); Güneş Nakiboğlu, Eindhoven (NL); Daan Daniel Johannes Antonius Van Sommeren, Beuningen (NL); Gijsbert Rispens, Eersel (NL); Johan Franciscus Maria Beckers, Veldhoven (NL); Theodorus Johannes Antonius Renckens, Breda (NL)

(73) Assignee: ASML NETHERLANDS B.V., Veldhoven (NL)

( * ) Notice: Subject to any disclaimer, the term of this patent is extended or adjusted under 35 U.S.C. 154(b) by 208 days.

(21) Appl. No.: 16/061,553

(22) PCT Filed: Dec. 22, 2016

(86) PCT No.: PCT/EP2016/082317
§ 371 (c)(1),
(2) Date: Jun. 12, 2018

(87) PCT Pub. No.: WO2017/109040
PCT Pub. Date: Jun. 29, 2017

(65) Prior Publication Data
US 2020/0166845 A1    May 28, 2020

(30) Foreign Application Priority Data

Dec. 23, 2015  (EP) .................................... 15202291
Feb. 4, 2016   (EP) .................................... 16154256

(51) Int. Cl.
    *G03F 7/16*    (2006.01)
    *G03F 7/20*    (2006.01)

(52) U.S. Cl.
    CPC ............ *G03F 7/2028* (2013.01); *G03F 7/168* (2013.01); *G03F 7/2041* (2013.01); *G03F 7/2053* (2013.01)

(58) Field of Classification Search
    CPC ........ G03F 7/0045; G03F 7/162; G03F 7/168; G03F 7/16; G03F 7/38; G03F 7/2022;
    (Continued)

(56) References Cited

U.S. PATENT DOCUMENTS 6,238,587 B1   5/2001 Siniaguine et al.
8,641,831 B2   2/2014 Benson
(Continued)

FOREIGN PATENT DOCUMENTS

CN   1501846 A   6/2004
CN   1539560 A   10/2004
(Continued)

OTHER PUBLICATIONS

International Search Report and Written Opinion issued for International Patent Application No. PCT/EP2016/082317, dated Jun. 1, 2017.
(Continued)

*Primary Examiner* — Mesfin T Asfaw
(74) *Attorney, Agent, or Firm* — Pillsbury Winthrop Shaw Pittman, LLP

(57) ABSTRACT

A method of processing a substrate includes: providing a substrate with a layer of photosensitive material on a surface of the substrate; and removing at least part of the photosensitive material from around an outer edge of the layer of photosensitive material so as to generate an edge, having a radial width, around the layer of photosensitive material
(Continued)

remaining on the surface of the substrate, wherein the photosensitive material varies in thickness forming a thickness profile across the radial width and the removing is controlled so as to generate variation in the thickness profile along the length of the edge, and/or wherein the removing is controlled so as to generate a rough edge around the layer of photosensitive material remaining on the surface of the substrate.

20 Claims, 13 Drawing Sheets

(58) Field of Classification Search
CPC ........ G03F 7/40; G03F 7/2028; G03F 7/2032; G03F 7/36; G03F 7/422; G03F 7/30; G03F 7/70991; G03F 7/24; G03F 7/70925; G03F 7/709; G03F 7/70341; G03F 7/20; G03F 7/70791; G03F 7/70466; H01L 21/0274; H01L 21/0273; H01L 21/027; H01L 21/67051; H01L 21/6715; H01L 21/67253; B65H 20/34
See application file for complete search history.

(56) References Cited

U.S. PATENT DOCUMENTS

| | | | |
|---|---|---|---|
| 2002/0098709 A1* | 7/2002 | Wu | G03F 7/2028 438/724 |
| 2004/0126923 A1 | 7/2004 | Benson | |
| 2004/0154638 A1 | 8/2004 | Reder et al. | |
| 2005/0020087 A1 | 1/2005 | Wagner et al. | |
| 2007/0093067 A1 | 4/2007 | Chang et al. | |
| 2009/0004865 A1* | 1/2009 | Kastenmeier | H01L 21/02087 438/694 |
| 2009/0011369 A1 | 1/2009 | Wong et al. | |
| 2009/0201485 A1 | 8/2009 | Van Der Heijden et al. | |
| 2012/0305030 A1 | 12/2012 | Chalom et al. | |

FOREIGN PATENT DOCUMENTS

| | | |
|---|---|---|
| CN | 101339366 A | 1/2009 |
| JP | 10-294250 | 11/1998 |
| KR | 10-2005-0070968 | 7/2005 |
| KR | 10-2007-0014576 | 2/2007 |
| TW | 594868 | 6/2004 |
| TW | 200505617 | 2/2005 |
| TW | 200845259 | 11/2008 |
| WO | 97/45856 | 12/1997 |

OTHER PUBLICATIONS

Office Action issued for Taiwan (ROC) Patent Application No. 105143104, dated Aug. 9, 2017.
Penkov, et al., "A review of recent applications of atmospheric pressure plasma jets for materials processing," J. Coatings Technology and Research, 12(2), pp. 225-235 (2015).
Schütze, et al., "The Atmospheric-Pressure Plasma Jet: A Review and Comparison to Other Plasma Sources," IEEE Transactions on Plasma Science, vol. 26, No. 6, pp. 1685-1694 (1998).
Chen, et al., "Photo-resist stripping process using atmospheric micro-plasma system," J. Phys. D: Appl. Phys. 42 (2009), pp. 1-8.
Yoshiki, et al., "Localized Removal of a Photoresist by Atmospheric Pressure Micro-Plasma Jet Using RF Corona Discharge," Japanese J. Appl. Phys., vol. 41, Part 1, No. 9, Sep. 2002, pp. 5797-5798.
Jeong, et al., "Etching materials with an atmospheric-pressure plasma jet," Plasma Sources Sci. Technol., vol. 7 (1998), pp. 282-285.
Office Action dated Dec. 10, 2020 issued in corresponding Chinese Patent Application No. 201680082291.0.

* cited by examiner

METHOD FOR REMOVING PHOTOSENSITIVE MATERIAL ON A SUBSTRATE

CROSS-REFERENCE TO RELATED APPLICATIONS

This application is the U.S. national phase entry of PCT patent application no. PCT/EP2016/082317, which was filed on Dec. 22, 2016, which claims the benefit of priority of European patent application no. 15202291.9, and European patent application no. 16154256.8, which were filed on Dec. 23, 2015, and Feb. 4, 2016, respectively, each of which is incorporated herein in its entirety by reference.

FIELD

The present disclosure relates to a method and apparatus for removing photosensitive material from around an outer edge of a substrate.

BACKGROUND

A lithographic apparatus is a machine that applies a desired pattern onto a substrate, usually onto a target portion of the substrate. A lithographic apparatus can be used, for example to manufacture integrated circuits (ICs). In such a case, a device for forming a pattern, for example, a mask or a reticle, can generate a circuit pattern to be formed on an individual layer of the IC. This pattern can be transferred onto a target portion (for example, including part of, one or several dies) on a substrate (for example, a silicon wafer). Transfer of the pattern is typically via imaging onto layer of photosensitive material (resist) provided on the substrate. Transfer may occur via a projection system in the lithographic apparatus. Generally, a single substrate will contain a network of adjacent target portions that are successively patterned. Conventional lithographic apparatuses include so-called steppers, in which each target portion is irradiated by exposing an entire pattern onto the target portion at once, so-called scanners, in which each target portion is irradiated by scanning of the pattern through a radiation beam in a given direction (the "scanner"—direction) while synchronously scanning the substrate parallel or anti-parallel to this direction.

In so-called immersion lithographic apparatuses, an immersion liquid, having a relatively high refractive index (e.g. water), is provided to fill a space between a final element of the projection system and the substrate. The point of this is to enable imaging of a smaller feature since the exposure radiation will have a shorter wavelength in the immersion liquid. The effect of the immersion liquid may also be regarded as increasing the effective numerical aperture (NA) of the system and also increasing the depth of focus.

Photosensitive material may be applied to a substrate in any way, for example, by spin coating. This includes applying liquid photosensitive material on a surface of the substrate which is to be irradiated and spinning the substrate about its axis to subject the liquid photosensitive material to a centrifugal force. This force causes the photosensitive material to spread out over the surface of the substrate and form a thin uniform layer on the surface. However, after the spinning process, a relatively thick ring of photosensitive material may form at the edge of the substrate. Other methods, which may also result in a thick ring, include spray coating, dip coating, inkjet printing, etc. The thick ring is often referred to as an edge bead. The edge bead may cause defects, for example, due to cross contamination from substrate handling. Therefore, it is desirable to remove the edge bead prior to processing to reduce errors which can result in decreased yield and reduced availability of the lithographic apparatus. As such, photosensitive material at the edge of the substrate may be removed, for example by using a nozzle to remove photosensitive material around the edge of the substrate in a uniform manner.

In an immersion lithographic apparatus, a liquid confinement structure (such as a fluid handling structure, an immersion hood, a nozzle member or the like) confines immersion liquid to an immersion space relative to which the surface of the substrate (on which the remaining photosensitive material is located) is moved. As the surface of the substrate moves relative to the immersion liquid, any variation or irregularity on the surface of the substrate may act as a meniscus pinning feature. In particular, the surface of the substrate and/or the edge of the photosensitive material remaining on the surface of the substrate after conventional edge bead removal process may act a meniscus pinning feature as the immersion liquid passes over the edge of the photosensitive material. This means that as the substrate and/or the edge of the photosensitive material moves away from the liquid confinement structure, the meniscus of the immersion liquid between the surface of the substrate and the liquid confinement structure is stretched. After the substrate and/or edge of the photosensitive material has moved a certain distance, the meniscus will eventually break and immersion liquid is left on the surface of the substrate resulting in droplets on the substrate which can lead to defects, e.g. watermarks. The remaining droplets may thus lead to errors on the surface of the photosensitive material which can reduce yield.

SUMMARY

An aim of the present invention is to avoid or reduce defects, e.g. watermark formation, as a result of water loss deriving due to the edge of the layer of photosensitive material on a surface of the substrate.

In the present invention, there is provided a method of processing a substrate comprising: providing a substrate with a layer of photosensitive material on a surface of the substrate; and removing photosensitive material from around an outer edge of the layer of photosensitive material, and controlling the removing so as to generate an edge, having a radial width, around the layer of photosensitive material remaining on the surface of the substrate, wherein the photosensitive material varies in thickness forming a thickness profile across the radial width and the removing is controlled so as to generate variation in the thickness profile along the length of the edge.

In the present invention there is provided an apparatus for processing a substrate comprising: a substrate support system configured to support a substrate, the substrate comprising a layer of photosensitive material on a surface thereof; and a substrate edge processing unit is configured to remove photosensitive material from around an outer edge of the layer of photosensitive material, wherein the substrate edge processing unit is configured to generate an edge, having a radial width, around the layer of photosensitive material remaining on the surface of the substrate when removing the photosensitive material, wherein the photosensitive material varies in thickness forming a thickness profile across the radial width and the substrate edge processing unit is configured to control the removing so as to control variation in the thickness profile along the length of the edge.

In the present invention there is provided a lithographic apparatus comprising the patterning apparatus as described in any of the embodiments herein.

Further features and advantages of the embodiments, as well as the structure and operation of various embodiments, are described in detail below with reference to the accompanying drawings. It is noted that the invention is not limited to the specific embodiments described herein. Such embodiments are presented herein for illustrated purposes only. Additional embodiments will be apparent to the person skilled in the relevant art based on the teachings contained herein.

BRIEF DESCRIPTION OF THE DRAWINGS

The accompanying drawings, which are incorporated herein and form part of the specification illustrate the present invention and, together with the description, further serve to explain principles of the invention and to enable the person skilled in the relevant art(s) to make and use the invention.

Figure 1:
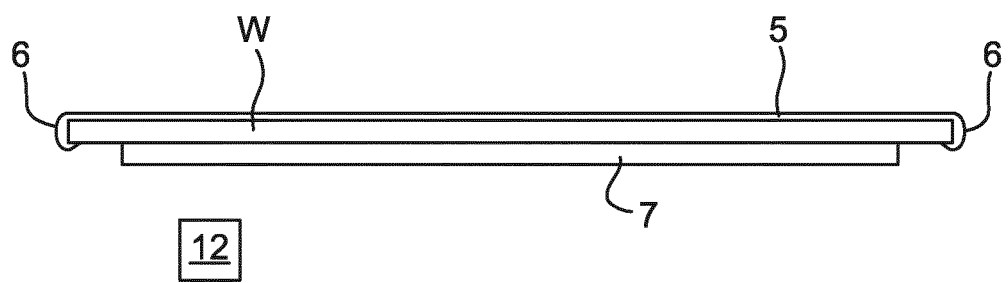
FIG. 1 is a schematic illustration of a side view of a substrate held on a substrate support.

The Figures are schematic and are not drawn to scale. Many of the Figures only show portions of features and components described, and for example, the features and components may extend in the direction of wavy or dotted lines in the figures. The features and advantages of the disclosed embodiments will become more apparent from the detailed description set forth below when taken in conjunction with the drawings, in which like reference characters identify corresponding elements throughout.

DETAILED DESCRIPTION

A substrate W, as described above, is provided with a layer of photosensitive material 5 on the surface of the substrate W as depicted in FIG. 1. The layer of photosensitive material 5 may be provided in any manner. The method may include providing liquid photosensitive material on the surface of the substrate W and spinning the substrate W to spread out the liquid photosensitive material as described above. As shown in FIG. 1, an edge bead 6 may form at the edge of the substrate W. The edge bead 6 may be non-uniform with the remaining layer of photosensitive material 5. The edge bead 6 may also be located over the outer edge of the substrate W and may be present on the outer edge of a surface of the substrate W on the other side of the substrate W, as depicted in FIG. 1. Alternatively, the method may include providing a substrate W with a layer of photosensitive material 5 already on the surface of the substrate 5. The substrate W depicted in FIG. 1 is shown as being supported by a substrate support 7. The substrate support 7 is optional but can be used to control movement, i.e. translation and rotation, of the substrate W as necessary.

Figure 2:
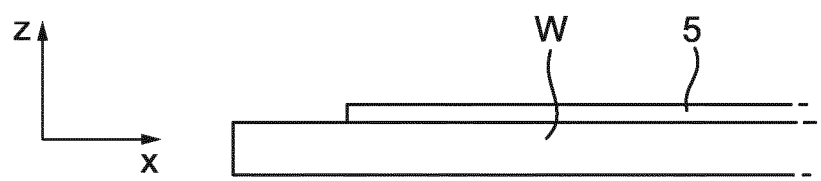
FIG. 2 is a schematic illustration of a side view of a portion of a substrate wherein the edge bead has been removed.

As described above, photosensitive material around the outer edge of the layer of photosensitive material 5 may be removed to remove the edge bead 6 thus making the layer of photosensitive material 5 more uniform. However, known methods of removing the edge bead 6 of a layer of photosensitive material 5 provide a neat edge around the layer of photosensitive material 5 remaining on the surface of the substrate W. The edge of the layer of photosensitive material 5 remaining on the surface of the substrate W is a sharp step, as depicted in FIG. 2. Using known methods and apparatus, the sharp step is uniform around the circumference of the substrate W. In other words, the step is substantially uniform in a circumferential direction. The step around the edge of the layer of photosensitive material 5 remaining on the surface of the substrate W may thus pin immersion liquid as it passes over the substrate W as described above. This can be known as film pulling. This leads to droplets on the surface of the substrate W and may cause defects, e.g. watermarks as described.

FIGS. 3A to 3D depicts how water loss occurs as the edge of the layer of photosensitive material 5 passes under a liquid confinement structure IH due to film pulling. FIGS. 3A-3D and 4A-4E show the very edge of the layer of photosensitive material 5 on top of the substrate W. Only a small part of the layer of photosensitive material 5 on top of the substrate W and the substrate W is shown. The Figures are intended to be illustrative and are not to scale and the layer of photosensitive material 5 may extend to the right in any of FIGS. 3A to 4E, and the substrate W may extend further than the wavy lines (i.e. to the right or downwards) in any of FIGS. 3A to 4E.

Figure 3A:
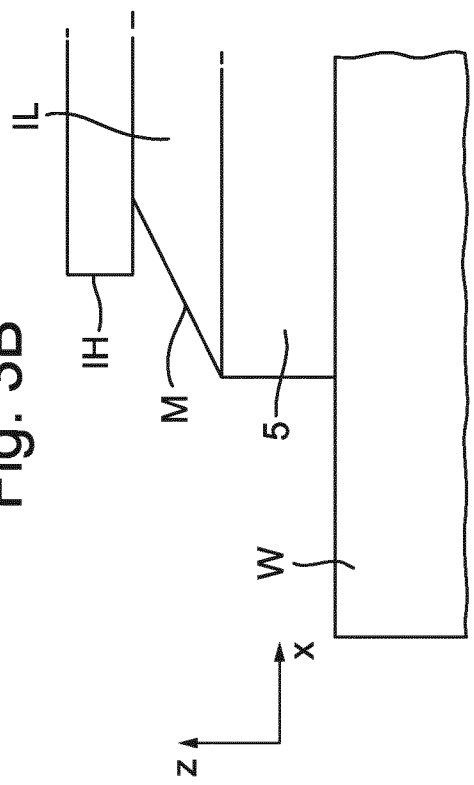
FIGS. 3A-3D depict, in cross-section, a close up view of droplets being deposited on a substrate wherein the edge bead has been removed as in FIG. 2.

As depicted in FIG. 3A, the liquid confinement structure IH confines immersion liquid IL to an immersion space. The layer of photosensitive material 5 is moved relative to the liquid confinement structure IH. The side surface of the immersion liquid IL is defined by a meniscus M. The meniscus M is the surface of the immersion liquid IL extending between the liquid confinement structure IH and the substrate W and/or layer of photosensitive material 5. The shape and curvature of the meniscus M is affected by surface tension. The shape of the meniscus M changes depending on the direction and speed of relative movement between the liquid confinement structure IH and the substrate W and/or layer of photosensitive material 5.

FIGS. 3A to 3D depict the relative movement of the liquid confinement structure IH across the layer of photosensitive material 5. Generally, the liquid confinement structure IH is stationary and the substrate W is moved relative to the liquid confinement structure IH. However, for illustrative purpose, the movement of liquid confinement structure IH relative to the substrate W is described throughout the description. FIGS. 3A to 3D represent a chronological sequence. The liquid confinement structure IH is in motion from left to right in FIGS. 3A to 3D, i.e. over the surface of the layer of photosensitive material 5 away from the edge of the substrate W.

Figure 3B:
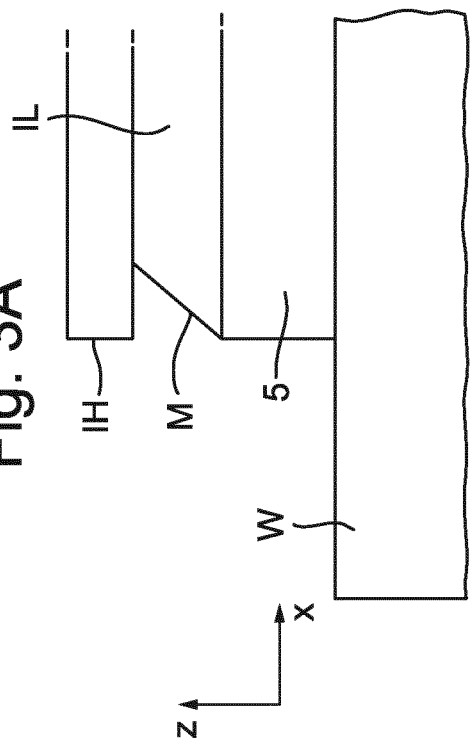

In FIG. 3A, the liquid confinement structure IH is moving to the right. The bottom of the meniscus M is at the edge of the layer of photosensitive material 5. As shown in FIG. 3B, when the liquid confinement structure IH continues to move away from the edge of the layer of photosensitive material 5, the meniscus M remains in contact with the edge of the layer of photosensitive material 5. In other words, the meniscus M is pinned at the edge of the layer of photosensitive material 5.

Figure 3C:
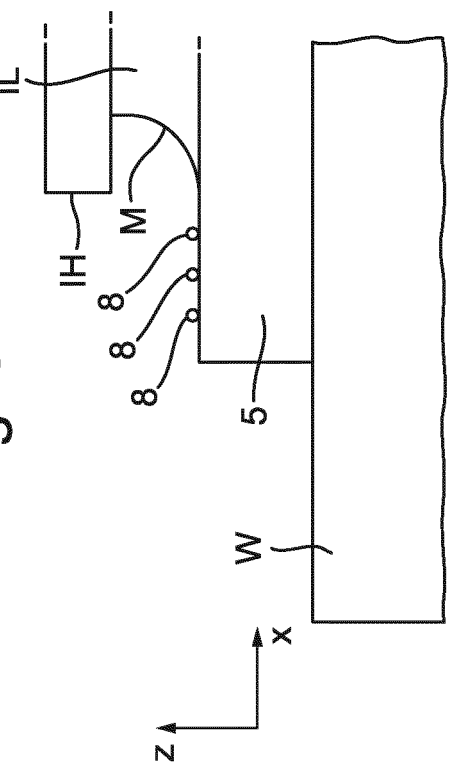
Figure 3D:
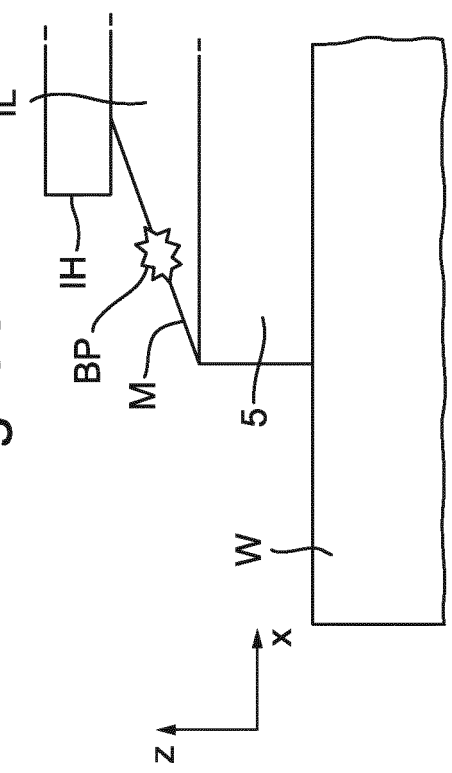

As shown in FIG. 3B, when the liquid confinement structure IH continues to advance, the meniscus M stretches. FIG. 3C depicts the situation in which the meniscus M has stretched so far that the meniscus M breaks at a breaking point BP. At this point in time, the meniscus M remains pinned at the edge of the layer of photosensitive material 5. FIG. 3D depicts the effect of the meniscus M breaking at the breaking point BP. In particular, when the meniscus M breaks, droplets 8 of the immersion liquid IL are deposited on the layer of photosensitive material 5. These droplets equate to water loss on the surface of the layer of photosensitive material 5, which can result in defects, e.g. watermarks. The term "defects" is used from hereon in to include various different defects on the surface of the substrate W. For example, the term may specifically mean watermark defects in the description below.

Although the meniscus M is shown having a contact point on the edge of the layer of photosensitive material 5 in FIGS. 3A-3D, this is for example only. Instead, the meniscus M may have a contact point on the exposed surface of the substrate W. The meniscus M may break in the same way as described above, but with the pinning occurring on the surface of the substrate W instead of at the edge of the layer of photosensitive material 5.

The present invention provides a method of processing the substrate W to reduce or avoid defects on the surface of the layer of photosensitive material 5. The method includes providing a substrate W with a layer of photosensitive material 5 on a surface of the substrate W, for example as depicted in FIG. 1. The method further comprises removing photosensitive material from around an outer edge of the layer of photosensitive material 5. In other words, removing the outer edge of the layer of photosensitive material 5 on the surface of the substrate W.

The method includes controlling the removing so as to generate an edge, having a radial width, around the layer of photosensitive material 5 remaining on the surface of the substrate W, wherein the photosensitive material varies in thickness forming a thickness profile across the radial width and the removing is controlled so as to generate variation in the thickness profile along the length of the edge. In other words, there is variation in the thickness profile around the edge of the layer of photosensitive material 5 which varies in the circumferential direction.

Additionally, or alternatively, the method includes controlling the removing so as to generate a rough edge around the layer of photosensitive material 5 remaining on the surface of the substrate W. The rough edge could have variation of the thickness profile in the circumferential direction as described above. Alternatively, the rough edge may have a rough thickness profile (i.e. across the radial width RW), but could be substantially uniform around the edge of the layer of photosensitive material 5 which remains on the surface of the substrate W. In other words, the edge may have a rough thickness profile which is constant around the edge of the remaining layer of photosensitive material 5. Having a rough thickness profile, i.e. a roughness in the radial direction, may mean that the thickness profile appears to have at least one significant protrusion or preferably more, and/or it may mean that the gradient of the thickness profile switches multiple times, and/or it may mean that the thickness has a substantially, constantly changing gradient and/or the thickness profile is not smooth.

Generating such an edge as described above should alter the pinning mechanism at the edge of the photosensitive material thus reducing the size and/or number of droplets left behind on the surface of the substrate W as described above.

As indicated, the edge can be non-uniform in the circumferential direction. In other words, the thickness varies when viewed in cross-section across the radial width of the edge at different locations around the edge. Therefore, the shape of the edge when viewed in cross section across the edge changes in the circumferential direction. The variation may be uniform or non-uniform. The variation may be patterned, i.e. may form a pattern when viewed in plan view. In an embodiment, the variation may be uniform and the edge may be a step edge having a repeating pattern in plan view. For example, the pattern may be in the shape of a sinusoidal wave, triangular wave, square wave or a rectangular wave. The shape of the pattern is not particularly limiting. In an embodiment, the variation may be non-uniform, for example, the edge may be a step edge with a non-repeating, non-uniform pattern in plan view. Thus the pattern may have a generally sinusoidal, triangular, square and/or rectangular wave shape, but may have non-uniform variations of amplitude and/or wavelength along the length of the edge. In an embodiment, the edge may be non-uniform and may be a rough edge.

In an embodiment, the edge is a rough edge. Providing a rough edge around the remaining layer of photosensitive material 5 means that the edge is no longer step-shaped. The roughness of the rough edge may be referred to as a micro-roughness. The rough edge has an alternating local structure, i.e. a non-uniform structure which will lead to circumferential and radial contact angle/height variations. This may mean that the rough edge is controlled to alter the azimuthal and/or radial roughness. Providing a rough edge around the layer of photosensitive material 5 alters the pinning effect of the edge of the layer of photosensitive material 5 and may thus lead to less film pulling and thus, less water loss, therefore reducing or avoiding defects on the surface of the substrate W. As indicated above, the rough edge may be uniform in the circumferential direction and may therefore have the same thickness profile around substantially the entire edge of the layer of photosensitive material 5 which remains on the surface or the substrate W. Alternatively, as already described, the rough edge can be non-uniform in the circumferential direction. The rough edge may be defined as rough in the radial direction (i.e. the thickness profile across a radial width RW as described below) and/or in the circumferential direction (i.e. along the length of the edge).

Figure 4A:
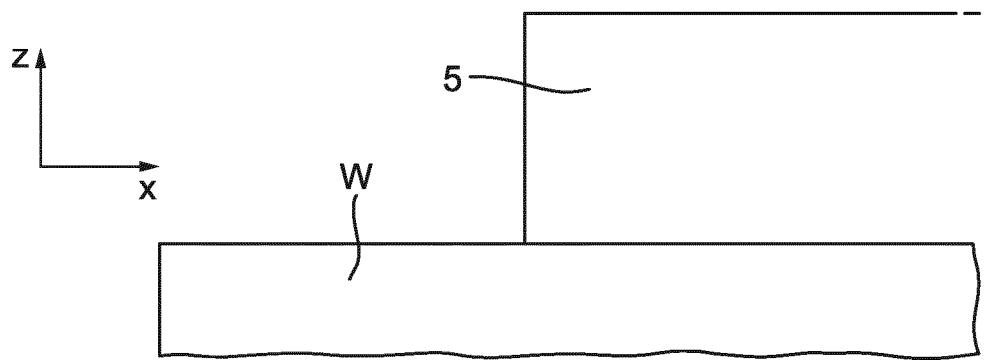
FIG. 4A is a close up view of the edge of the remaining layer of photosensitive material in FIG. 2.
Figure 4B:
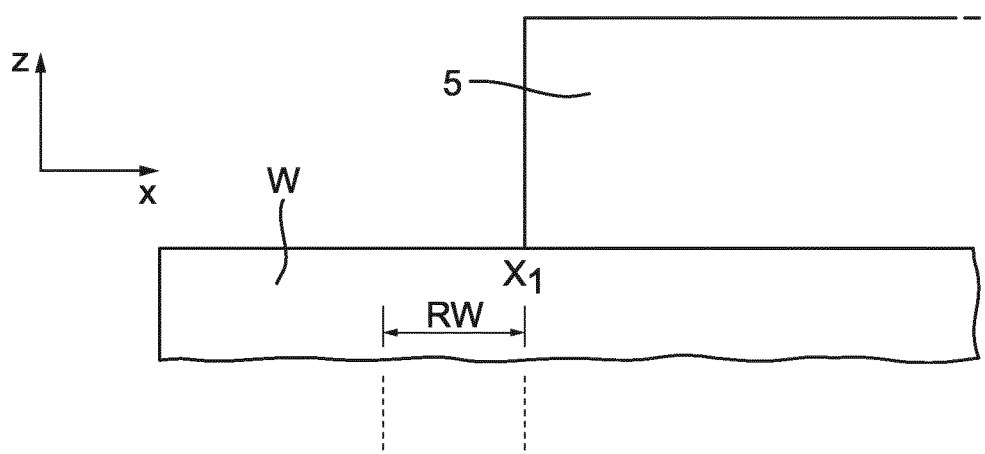
FIGS. 4B-4E are close up views of the edge of the remaining layer of photosensitive material generated according to embodiments.
Figure 4C:
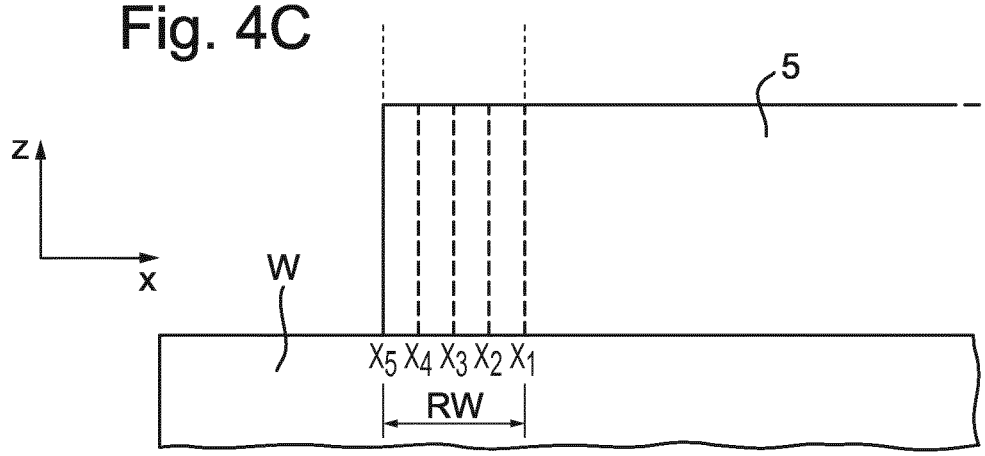
Figure 4D:
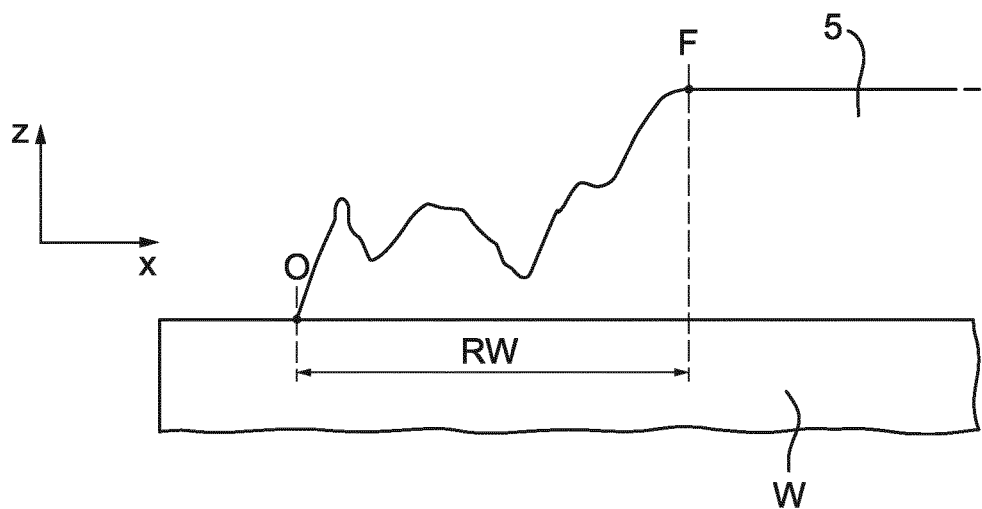
Figure 4E:
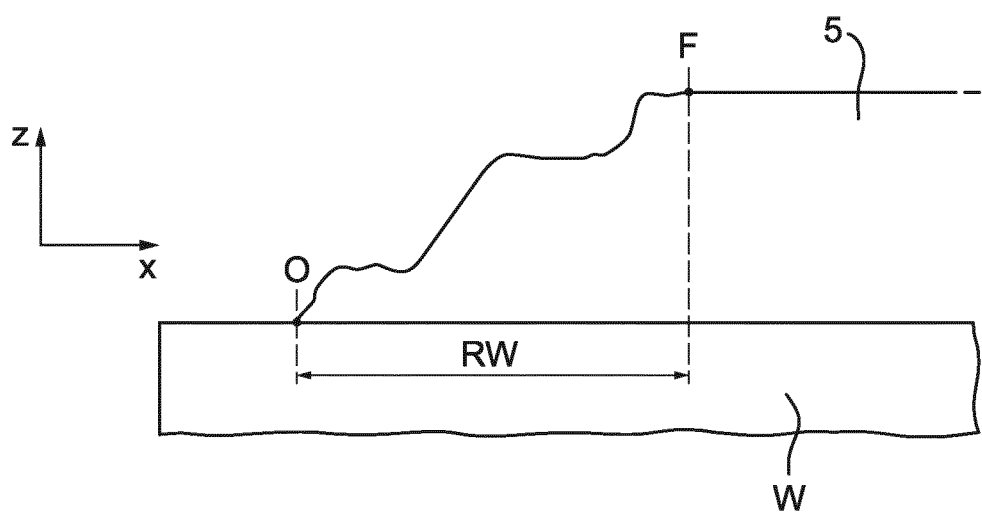

The rough edge may have a radial width RW as depicted in FIGS. 4D and 4E, rather than being a sharp vertical edge depicted in FIGS. 2 and 4A-4C. In other words, the radial width RW may be a length in the radial direction (i.e. the x-direction depicted in FIGS. 4A-4E). FIGS. 4A to 4E are examples of possible thickness profiles at the edge at different points around the edge. FIGS. 4D and 4E show possible thickness profiles over a rough edge. (FIGS. 4B and 4C will be described in detail below.) The thickness of the photosensitive material may change over the radial width RW (i.e. length in the radial direction) non-uniformly. Thus, the thickness may be similar to the thickness profile depicted in FIG. 4D at one point around the edge, but may be similar to the thickness profile depicted in FIG. 4E at another point around the edge. Alternatively, the thickness profile could be uniform along the length of the edge. The rough edge may have non-uniform variation in the z-direction over the radial width RW of the rough edge, as depicted in FIGS. 4D and 4E. The variation may be non-uniform in the radial direction (i.e. x-direction of FIGS. 4D and 4E) and/or the circumferential direction (i.e. the direction orthogonal to both the x-direction and z-direction which is indicated by the difference between FIGS. 4D and 4E).

The rough edge may be a gradual edge which increases in thickness from substantially zero to a thickness substantially the same as the remaining layer of photosensitive material 5 on the surface of the substrate W. Alternatively, the rough edge may be considered as starting when the thickness of photosensitive material on the substrate W is greater than or equal to 20% of the thickness of the remaining layer of photosensitive material 5. Alternatively, the rough edge may be a gradual edge which increases in thickness from the edge of the substrate W. The rough edge may be non-uniform across the radial width RW of the edge and may increase in thickness in a non-uniform manner.

The rough edge may have an average ratio of the thickness (i.e. distance in the z-direction in FIGS. 4D and 4E) of the layer of photosensitive material 5 to the radial width RW of the rough edge. The radial width RW is the radial length of the rough edge in the radial direction. The radial width RW may be determined from the most radially outward point O along a radial path where photosensitive material can be found on the surface of the substrate W, to the point F on the remaining layer of photosensitive material 5 which is the starting point at which the remaining layer of photosensitive material 5 is substantially flat. The remaining layer of photosensitive material 5 may be considered to be substantially flat when the variation of the surface of the remaining layer of photosensitive material 5 is approximately less than or equal to 1% of the surface thickness. The thickness (i.e. distance in the z-direction in FIGS. 4A-4E) may be determined to be the average thickness of the remaining layer of photosensitive material 5 when it is considered to be substantially flat, i.e. as depicted in FIG. 4A. In an embodiment, the average ratio may be greater than or equal to at least approximately $0.25 \times 10^{-3}$, or preferably greater than $1 \times 10^{-3}$, or more preferably greater than $1.7 \times 10^{-3}$. In an embodiment, the ratio may be less than or equal to at least approximately 0.15, or preferably less than $30 \times 10^{-3}$, or more preferably less than $15 \times 10^{-3}$.

Although not depicted in FIGS. 4D and 4E, at least a portion of the rough edge may have a height (in the Z direction in the figures) which is higher than the remaining layer of photosensitive material 5. This may be due to photosensitive material being redeposited during the removing steps, especially for example when a fluid (e.g., solvent) is used as described below. In other words, the thickness of the rough edge across the radial width RW may be higher than the thickness on the remaining layer of photosensitive material 5, e.g. at point F.

In an embodiment, removing photosensitive material from around the outer edge of the layer of photosensitive material 5 comprises spraying a fluid on the layer of photosensitive material 5 around the outer edge of the layer of photosensitive material 5. In this embodiment, the fluid is a liquid solvent, referred to as solvent 15 from herein. The solvent 15 is a solvent for the photosensitive material, i.e. the solvent 15 dissolves the photosensitive material. The solvent 15 may be sprayed using a nozzle. The method may include oscillating the nozzle when spraying the solvent 15 so as to generate the rough edge. In other words, the nozzle may be moved back and forth in a regular manner. The nozzle may be referred to as an oscillating nozzle 10. A controller 11 may be provided to control oscillation of the oscillating nozzle 10. In an embodiment, oscillating the oscillating nozzle 10 in this way may circumferentially modulate the edge of the layer of photosensitive material 5, such that the rough edge is similar to a rough corrugated pipe edge.

Figure 5:
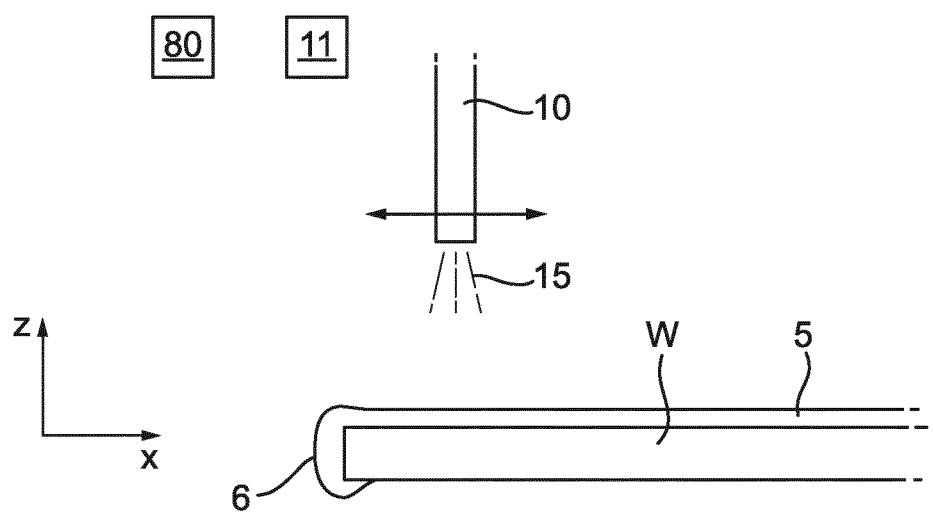
FIG. 5 is a schematic illustration of a side view of a portion of a substrate and a nozzle, according to an embodiment.

The oscillating nozzle 10 may be oscillated back and forth above the substrate W and/or the layer of photosensitive material 5 in plan view, i.e. the oscillating nozzle 10 may generally be positioned above the substrate W and/or the layer of photosensitive material 5 whilst oscillating. This may mean that the oscillating nozzle 10 is above the substrate W and/or the layer of photosensitive material 5 at all times during the oscillation. The back and forth motion of the oscillating nozzle 10 is depicted by arrows in FIG. 5. In an embodiment, the method includes oscillating the oscillating nozzle 10 in a substantially radial direction. As the substrate W may rotate whilst the oscillation occurs, the relative movement between the oscillating nozzle 10 and the surface of the substrate W may appear to form a circular or helical path in a plan view.

In any of the above embodiments, the oscillating nozzle 10 is continuously oscillating, i.e. the oscillating nozzle 10 continuously moves back and forth above the substrate W. This may mean that the oscillating nozzle 10 is continuously oscillating as long as solvent 15 is being sprayed.

In any of the above embodiments, the method comprises controlling the frequency and/or amplitude of oscillation of the oscillating nozzle 10 depending on at least one property of the photosensitive material. Controlling the frequency and/or amplitude of oscillation may alter the characteristics of the rough edge produced around the layer of photosensitive material 5 remaining on the surface of the substrate W. For example, the frequency and/or amplitude of oscillation of the oscillating nozzle 10 may alter the pitch and depth of the features of the rough edge, i.e. may alter the structure such that the edge has a non-uniform structure. The non-uniform structure may have circumferential and radial contact angle/height variations. Thus, controlling these features of oscillation of the oscillating nozzle 10 can affect the properties of the rough edge and may thus be controlled to take into account of the effect of the rough edge, e.g. to take into account resulting defects and/or water loss on the substrate W in order to reduce or avoid defects occurring. In this way, controlling these features of oscillation of the oscillating nozzle 10 may be controlled based on some sort of feedback from at least one sensor and/or processor.

In an embodiment, an indication of the resulting defects and/or water loss on the substrate W may be provided. For example, a measurement unit 80 may detect and/or measure the resulting defects and/or water loss on the substrate W after exposure of the substrate W in a lithographic apparatus and provide the indication of the resulting defects and/or water loss on the substrate W. The measurement unit 80 may alternatively measure the profile of the edge to determine/predict an indication of the resulting defects and/or water loss on the substrate W. The measurement unit 80 may be used offline (i.e. after exposure) and may only use test substrates W. The measurement unit 80 may be external to the apparatus used in any of the above embodiments, for example, the measurement unit 80 may be part of a lithographic apparatus. In an embodiment, the measurement unit 80 may send control signals to, or receive control signals from, the controller 11. The measurement unit 80 is depicted as an external unit in FIG. 5, which may communicate with the embodiments as described above. The measurement unit 80 could be provided to communicate with embodiments as depicted in any of FIGS. 6-9, or may not be provided to communicate with in the embodiment depicted in FIG. 5.

It may be determined that a change is required in the oscillating nozzle 10, for example, the amplitude, frequency and/or flow rate of the solvent 15 being sprayed by the oscillating nozzle 10 may be changed. The controller 11 may be used to determine the change required and change the characteristic of the oscillating nozzle 10. Alternatively, the controller 11 may receive input from the measurement unit 80 indicating the change for controlling the oscillating nozzle 10. An indication of the effect of the change on the resulting defects and/or water loss on the substrate W may be provided, for example by the measurement unit 80 described above, to determine if a further change is desirable.

In an embodiment, controlling the frequency of oscillation of the oscillating nozzle 10 includes controlling the frequency within a predetermined range of frequencies. Controlling the oscillation of the oscillating nozzle 10 within a predetermined range may control a wavelength of the rough edge, i.e. the frequency of oscillation can be altered to modulate/adjust the wavelength of the rough edge. The rough edge may be formed of so-called features along the edge. For example, a feature may be a structure, such as a substantially vortex structure, formed along the edge. The wavelength of the rough edge may be the distance between two so-called features, for example, the distance between two relatively large vortex structures along the edge. Thus, the average wavelength may be the average distance in the circumferential direction from the middle of one relatively large vortex structure to the middle of the next relatively large vortex structure. Therefore, the shape of the rough edge may be altered and controlled by controlling the frequency of oscillation of the oscillating nozzle 10. This may allow the frequency of oscillation to be controlled to reduce or avoid defects arising due to the edge of the remaining layer of the photosensitive material 5. In an embodiment, the frequency is approximately less than or equal to approximately 500 kHz, or preferably less than or equal to approximately 100 kHz, or more preferably less than or equal to approximately 50 kHz. In an embodiment, the frequency is approximately greater than or equal to approximately 500 Hz, or preferably greater than or equal to approximately 1 kHz, or more preferably greater than or equal to approximately 10 kHz.

In an embodiment the frequency of oscillation of the oscillating nozzle 10 is controlled so that the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the frequency of oscillation of the oscillating nozzle 10 is controlled so that the typical wavelength is greater than or equal to approximately 10 μm, or preferably greater than or equal to approximately 50 μm, or more preferably greater than or equal to approximately 0.1 mm. Controlling the frequency of oscillation to generate a rough edge with a wavelength with these values, in particular the preferable and more preferable values, may reduce or even avoid defects due to the edge of the remaining layer of the photosensitive material 5.

In an embodiment, the method comprises controlling the amplitude of oscillation of the nozzle 10 within a predetermined range of amplitudes to control a radial width RW of the rough edge. Controlling the amplitudes of the oscillating nozzle 10 within a predetermined range may control a radial width RW of the rough edge, i.e. the amplitude of oscillation can be altered to modulate/adjust the width of the rough edge in the radial direction. Therefore, the shape of the rough edge may be altered and controlled by controlling the amplitude of oscillation of the oscillating nozzle 10. This may allow the amplitude of oscillation of the oscillating nozzle 10 to be controlled to reduce or even avoid defects due to the edge of the remaining layer of the photosensitive material 5.

In an embodiment the amplitude of oscillation of the oscillating nozzle 10 is controlled so that the radial width RW is less than or equal to approximately 2 mm, or preferably less than or equal to approximately 0.5 mm, or more preferably less than or equal to approximately 0.3 mm. In an embodiment, the amplitude of oscillation of the oscillating nozzle 10 is controlled so that the radial width RW is greater than or equal to approximately 10 μm, or preferably greater than or equal to approximately 50 μm, or more preferably greater than or equal to approximately 0.1 mm Controlling the amplitude of oscillation to generate a rough edge with a radial width RW with these values, in particular the preferable and more preferable values, may reduce or avoid defects as described In an embodiment, the amplitude of oscillation of the oscillating nozzle 10 is approximately less than or equal to approximately 2 mm, or preferably less than or equal to approximately 0.5 mm, or more preferably less than or equal to approximately 0.3 mm. In an embodiment, the amplitude of oscillation of the oscillating nozzle 10 is approximately greater than or equal to approximately 10 μm, or preferably greater than or equal to approximately 50 μm, or more preferably greater than or equal to approximately 0.1 mm.

In any of the above embodiments, the oscillating nozzle 10 may be otherwise referred to as an edge bead removal nozzle.

In an embodiment, the method comprises oscillating the oscillating nozzle 10 at a predetermined frequency. The method may further comprise rotating the substrate W at a first frequency and oscillating the oscillating nozzle 10 at a second frequency. Rotating the substrate W at a first frequency may include providing the substrate W on a substrate support 7 and controlling rotation of the substrate support 7 around the axis of the substrate W. The method may comprise rotating the substrate W at hundreds or thousands of revolutions per minute. The second frequency may be higher than the first frequency. The second frequency may be significantly higher than the first frequency. In this context, significantly higher may mean that the second frequency is at least 10 times higher than the first frequency, or that the second frequency is at least 100 times higher than the first frequency, or that the second frequency is at least 1000 times higher than the first frequency.

Figure 6:
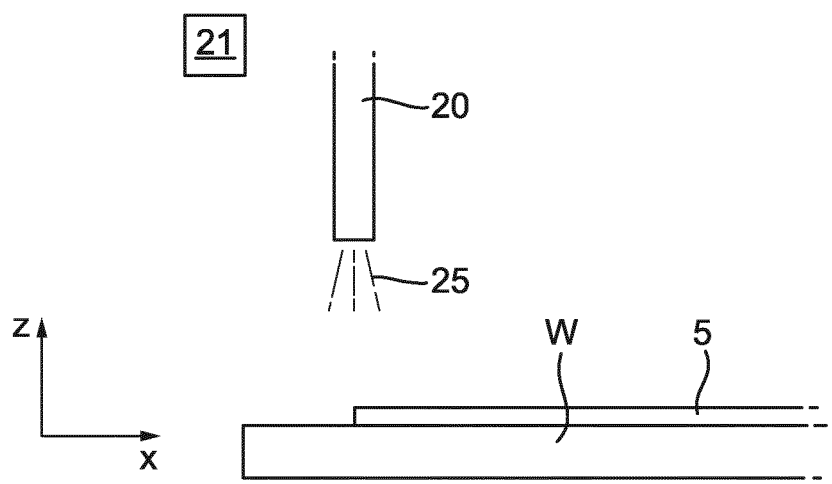
FIG. 6 is a schematic illustration of a side view of a portion of a substrate and a nozzle, according to an embodiment.

In an alternative embodiment, removing photosensitive material from an outer edge of the layer of photosensitive material 5 may comprise an initial removal step of removing photosensitive material around the outer edge of the layer of photosensitive material 5 and a further step of spraying a fluid from a nozzle 20 to remove further photosensitive material from around the remaining layer of photosensitive material 5 so as to generate the rough edge. The fluid may be a liquid solvent, referred to as solvent 25 from herein. The solvent 25 is a solvent for the photosensitive material, i.e. the solvent 25 dissolves the photosensitive material. In this embodiment, the first step may be carried out by a variety of methods, for example using an edge removal nozzle, or using the oscillating nozzle 10 as described in any of the above embodiments. However, in this embodiment, the rough edge is generated and controlled by spraying solvent 25 from the nozzle 20, to remove further photosensitive material from around the remaining layer of photosensitive material 5. This step is depicted in FIG. 6. The initial step of removal could be carried out using any known method which may result in a remaining layer of photosensitive material 5 on the surface of the substrate W without a rough edge as depicted in FIGS. 2, 4A, 6, 7 and 8. Therefore, the step of spraying the solvent 25 from the nozzle 20 to remove further photosensitive material from around the remaining layer of photosensitive material 5 is provided as part of the removal so as to generate a rough edge. A controller 21 may be provided to control the spraying of the solvent 25 from the nozzle 20.

The rough edge may have a non-uniform structure as described in any of the above embodiments i.e. in the radial and/or circumferential direction. The non-uniform structure of the rough edge may create unstable wavelength perturbations, which may thus lead to the meniscus M to break up faster, which may thus lead to less water loss, and also less defects.

In any of the above embodiments relating to the nozzle 20, the method may comprise controlling the step of spraying the solvent 25 from the nozzle 20 depending on at least one property of the photosensitive material. In an embodiment, the width of the spray of the solvent 25 or the spray from the nozzle 20 may be controlled depending on at least one property of the photosensitive material. Controlling the spray of solvent 25 from the nozzle 20 may alter the characteristics of the rough edge produced around the layer of photosensitive material 5 remaining on the surface of the substrate W. For example, the width and/or flow rate of the spray from the nozzle 20 may alter the pitch and depth of the features of the rough edge, i.e. may alter the structure such that the edge has a non-uniform structure. The non-uniform structure may have circumferential and radial contact angle/height variations. Thus, controlling the nozzle 20 can affect the properties of the rough edge and may thus be controlled to take into account of the effect of the rough edge, e.g. to take into account resulting defects and/or water loss on the substrate W in order to reduce or avoid defects occurring. In this way, controlling the spray from and movement of nozzle 20 may be controlled based on some sort of feedback from at least one sensor and/or processor.

In an embodiment, an indication of the resulting defects and/or water loss on the substrate W may be provided. The indication of the resulting defects and/or water loss on the substrate W may be provided using the measurement unit 80 as described above, for example with the embodiments depicted in FIGS. 6-9. However, in this embodiment, the measurement unit 80 may send control signals to, or receive control signals from, the controller 21. From using the indication received from the measurement unit 80 as described above, it may be determined that a change is required in the nozzle 20, for example, the flow rate of the solvent 25 being sprayed by the nozzle 20 and/or the speed of movement of the nozzle 20 and/or the width of the spray may be changed. The controller 21 may be used to determine the change required and change the characteristic of the nozzle 20. Alternatively, the controller 21 may receive input from measurement unit 80 indicating the change for controlling the nozzle 20. An indication of the effect of the change on the resulting defects and/or water loss on the substrate W may be provided, for example using the measurement unit 80 described above, to determine if a further change is desirable.

In an embodiment, the method may comprise controlling the width of the spray of the solvent 25 sprayed from the nozzle 20 within a predetermined range to control a radial width of the rough edge around the layer of photosensitive material 5 remaining on the surface of the substrate W. As described above, controlling the roughness, e.g. the radial width RW, of the rough edge around the layer of photosensitive material 5 can affect defects on the surface of the substrate W and thus may be controlled to reduce errors described above.

In an embodiment, the width of the spray of solvent 25 from the nozzle 20 is controlled so that the radial width RW of the rough edge is less than or equal to approximately 3 mm, or preferably less than or equal to approximately 2 mm, or more preferably less than or equal to approximately 0.5 mm. In an embodiment, the width of the spray of solvent 25 from the nozzle 20 is controlled so that the radial width RW of the rough edge is greater than or equal to approximately 0.01 mm, or preferably greater than or equal to approximately 0.05 mm, or more preferably greater than or equal to approximately 0.1 mm Controlling the width of the spray of solvent 25 from the nozzle 20 to generate a rough edge with a radial width RW with these values, in particular the preferable and more preferable values, may reduce or even avoid defects due to the edge of the remaining layer of the photosensitive material 5.

In an embodiment, the width of the spray of solvent 25 from the nozzle 20 is less than or equal to approximately 3 mm, or preferably less than or equal to approximately 2 mm, or more preferably less than or equal to approximately 0.5 mm. In an embodiment, the width of the spray of solvent 25 from the nozzle 20 is greater than or equal to approximately 0.01 mm, or preferably greater than or equal to approximately 0.05 mm, or more preferably greater than or equal to approximately 0.1 mm. In these embodiments, the width of spray may be the width of the spray on the substrate W, in other words, the width of the spray incident on the substrate W.

Figure 7:
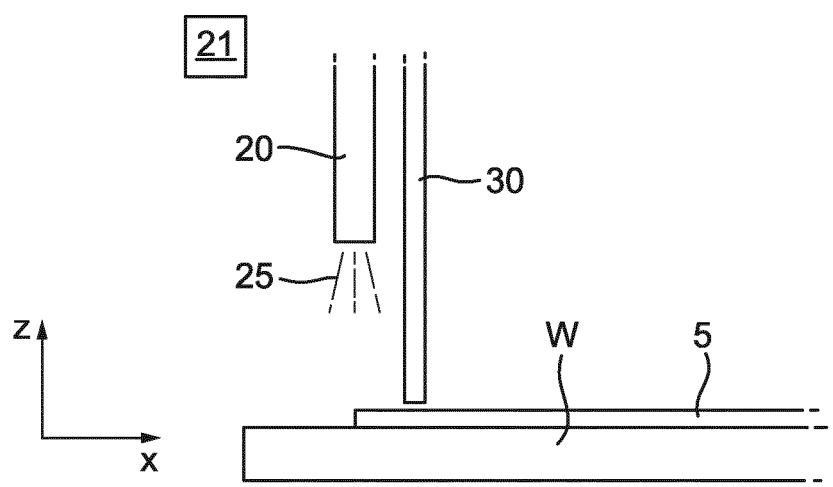
FIG. 7 is a schematic illustration of a side view of a portion of a substrate and a nozzle, according to an embodiment, wherein a barrier is provided.
Figure 8:
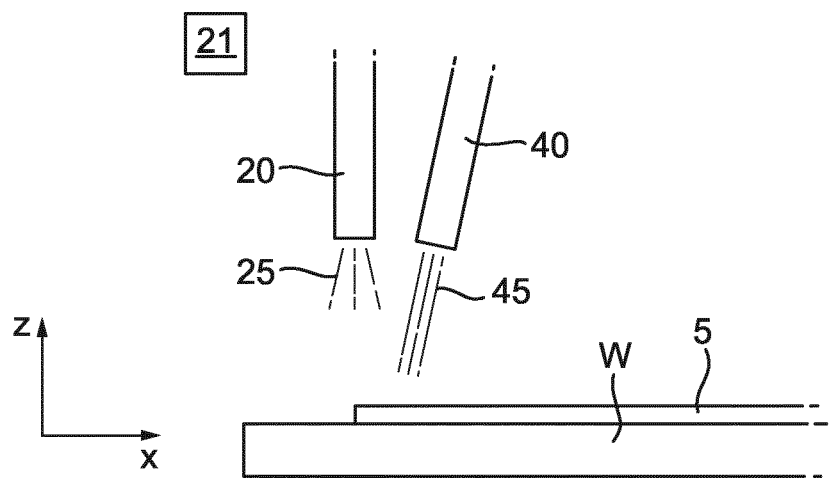
FIG. 8 is a schematic illustration of a side view of a portion of a substrate and a nozzle, according to an embodiment, wherein a barrier is provided.

In an embodiment, the method may further comprise providing a barrier as depicted FIG. 7 or 8. The barrier may be provided to protect part of the layer of photosensitive material 5 from the solvent 25 being sprayed by the nozzle 20, i.e. the barrier may form a shield. As the solvent 25 being sprayed will essentially dissolve the photosensitive material remaining on the surface of the substrate W, it may be preferable to control the amount of photosensitive material in the remaining layer of photosensitive material 5 on the surface of the substrate W which is affected by the additional solvent from nozzle 20. Therefore, providing a barrier allows application of the solvent 25 from the nozzle 20 to be limited to only some portions of the layer of photosensitive material 5 remaining the substance substrate W. The positioning of the barrier relative to the substrate W/remaining layer of photosensitive material 5 allows further control of the rough edge. In other words, the barrier may be used to define an inner edge of the rough edge (i.e. the location of where the rough edge ends and the substantially flat surface of the remaining layer of photosensitive material 5 begins). In this way, the barrier may be used to additionally control the radial width RW. The controller 21 may be used to control the barrier in addition to the nozzle 20. The controller 21 may comprise multiple sub control units, for example one control unit to control the nozzle 20 and another control unit to control the positioning of the barrier.

The barrier may have any shape and is not particularly limited. In an embodiment, the barrier may form a straight line in plan view. Alternatively, in an embodiment, the barrier may be substantially curved, or even U-shaped in plan view. Alternatively, in an embodiment, the barrier may be substantially V-shaped in plan view. Providing a barrier which is curved, U-shaped or V-shaped may be particularly useful, because it may be positioned substantially around the nozzle 20. This means that the barrier can be used to accurately control where the spray of solvent 25 lands on the remaining layer of photosensitive material 5.

In an embodiment, the barrier is a physical element 30 as depicted in FIG. 7. The physical element 30 may thus physically stop any solvent 25 from travelling radially inwards of the physical element 30. The material used for the physical element 30 is not particularly limited and may be any material that is appropriate. The physical element 30 may be a rigid element. The physical element 30 may be resistant to the solvent (e.g. solvent 15 and/or solvent 25).

In an alternative embodiment, the barrier may be a fluid jet 45 provided by further nozzle 40, wherein the fluid used for the fluid jet 45 is not a solvent for the type of material forming the layer of photosensitive material 5. The barrier comprising the fluid jet 45 is depicted in FIG. 8. The fluid jet 45 may be provided by projecting fluid forming the fluid jet 45 at high speed. The bather comprising the fluid jet 45 may have substantially the same effect as a barrier comprising the physical element 30. The barrier comprising the fluid jet 45 may provide more effective protection to the remaining layer of photosensitive material 5 than the physical barrier 30 because the fluid jet 45 can extend to the surface of the photosensitive material, whereas the physical element 30 will generally have to leave a gap between the end of the physical element 30 and the layer of photosensitive material 5 which means that some of the spray of solvent 25 from the nozzle 20 may pass under the gap affecting the remaining layer of photosensitive material 5 on the other side of the physical element 30.

The barrier as described herein (e.g. either the physical element 30 or the fluid jet 45 as described above) may be provided with oscillating nozzle 10.

Additionally or alternatively, the position of the nozzle 20 may be controlled to control the direction of solvent 25 as it reaches the substrate W. The position may be controlled to control which part of the layer of photosensitive material 5 that the solvent 25 affects. The position may be controlled, for example, by tilting the nozzle 20 to alter the direction of the spray of solvent 25. For example, this may cause the direction of the spray of solvent 25 to be radially outward which may reduce the amount of solvent 25 reaching the layer of photosensitive material 5 radially inward of the nozzle 20, thus protecting part of the layer of photosensitive material 5. Nozzle 10 may be controlled to spray solvent 15 in a similar way.

In any of the above embodiments, the step of spraying may comprise spraying droplets of solvent, the solvent being solvent 15 and/or solvent 25. In any of the above embodiment, the step of spraying solvent may comprise spraying aerosol comprising droplets of solvent, the solvent being either solvent 15 or solvent 25. Either way, the droplets of solvent may be controlled depending on at least one property of the photosensitive material. The method may comprise controlling the average diameter of the droplets of solvent 25 from the nozzle 20 within a predetermined range of average diameters to control the roughness around the outer edge of the layer of photosensitive material 5 remaining on the surface of the substrate W. In an embodiment, the average diameter of the droplets of solvent 25 from the nozzle 20 is less than or equal to 200 µm, or preferably 50 µm, or more preferably 30 µm. In an embodiment, the average diameter of the droplets of solvent 25 from the nozzle 20 is greater than or equal to 1 micron, or preferably 5 µm, or more preferably 10 µm.

In any of the above embodiments, solvent 15 and/or solvent 25 may be an organic solvent. In any of the above embodiments, solvent 15 and/or solvent 25 may comprise (or consist of) propylene glycol monomethyl ether (PGME), propylene glycol monomethyl ether acetate (PGMEA or PMA), Ethyl Lactate, Methyl Ethyl Ketone (2-butanone), Cyclohexanone, Gamma Butyrolactone, Diisoamyl ether, 4-methylpentan-2-ol, and/or Ethyl Lactate. The solvent 15 and/or solvent 25 may comprise of any combination comprising or consisting of these solvents. In an embodiment, the solvent 15 and/or the solvent 25 may comprise between 55% to 60% Ethyl Lactate and between 40% to 45% Methyl Ethyl Keton (2-butanone). In an embodiment, the solvent 15 and/or the solvent 25 may comprise between 60% to 80% propylene glycol monomethyl ether and between 20% to 40% propylene glycol monomethyl ether acetate.

In any of the above embodiments, the nozzle 10 or the nozzle 20 may be a sonic nozzle or an ultrasonic nozzle. In this embodiment, the nozzle 10 or the nozzle 20 may use high frequency sound waves, for example as produced by piezoelectric transducers, to create capillary waves in a liquid jet. When the amplitude of the capillary waves reaches a critical amplitude, the waves become too tall to support themselves and tiny droplets fall off the tip of each wave resulting in atomization. Thus, these nozzles may otherwise be known as atomizing nozzles and/or atomising micro-spray nozzles. The frequency of the sound waves may be controlled in any of the above embodiments to control and change the size of the droplets of solvent.

In any of the above embodiments, the fluid is not limited to being a solvent, and could also be another type of liquid. In this embodiment, the nozzle may be used as described in any of the above embodiments, except that the fluid may be configured to break down mechanically the photosensitive material for its removal. Thus, the fluid will need to be provided with enough force to remove the photosensitive material. Details of providing such a fluid configured to break down mechanically the photosensitive material are provided in U.S. Pat. No. 8,641,831 B2 which is herein incorporated by reference in its entirety. The liquid solvent described in any of the above embodiments may be replaced with another fluid, optionally in the form of a fluid jet. It may be advantageous to mechanically break down the photosensitive material, for example, to avoid using chemicals to dissolve the photosensitive material. The fluid may be provided as a jet, e.g. a gas jet or a liquid jet. The fluid could be any suitable fluid, including water. A liquid solvent could be used as a liquid jet.

Providing a rough edge around the remaining layer of photosensitive material 5 means that the thickness profile of the edge is not uniform in the circumferential direction and/or the variation of the thickness profile across the radial width RW is rough, i.e. the edge has a rough thickness profile. In an embodiment, the edge is a patterned edge. This means that the method includes controlling the removal of the photosensitive material to create defined features along the edge. As previously described, the pattern may be uniform or non-uniform and may be formed by a step edge which forms a shape in plan view. The shape of the pattern in plan view may be uniform in that it comprises a regular repeated portion. Alternatively, the shape of the pattern in plan view may be non-uniform in that it does not comprise regular repeated portions. The patterned edge has an alternating local structure, i.e. a structure which will lead to circumferential and radial contact angle/height variations. Providing a patterned edge around the layer of photosensitive material 5 alters the pinning effect of the edge of the layer of photosensitive material 5 and may thus lead to less film pulling and thus, less water loss, therefore reducing or avoiding defects on the surface of the substrate W.

The patterned edge may have a step edge, as depicted in FIGS. 4B and 4C. Although the sharp step appears similar in FIGS. 4A, 4B and 4C, the radial location of the step (i.e. in the x-direction) varies along the patterned edge in relation to FIGS. 4B and 4C, whereas it is substantially constant in the circumferential direction in FIG. 4A as in the prior art. FIG. 4B depicts an example where the step is at an example location of an innermost location $X_1$. FIG. 4C depicts an example where the step is at an outermost location $X_5$. The step may occur at any point between the innermost and outermost steps, e.g. at $X_2$, $X_3$, and/or $X_4$, as indicated in FIG. 4C by the dotted lines. The location in the x-direction will vary along the edge in the circumferential direction such that at one point, the step may be located at $X_2$, whereas at a different circumferential location, it may be located at any other location, e.g. $X_4$. It will be understood that the specific examples of $X_1$, $X_2$, $X_3$, $X_4$ and $X_5$ are only examples and the radial distance of the step may vary and may be located at other locations in the x-direction which are not shown.

The step edge could be replaced with a smooth transition, e.g. with an incline or curve, from the surface of the substrate W to the surface of the layer of photosensitive material 5 which is substantially flat. Either way, the patterned edge will have a radial width RW from an outermost point (e.g. $X_5$ in FIG. 4C) on the surface of the substrate W having substantially no photosensitive material radially outwards of that point to an innermost point (e.g. $X_1$ in FIGS. 4B and 4C) where the layer of photosensitive material 5 is substantially uniform in thickness, i.e. at a constant thickness, radially inwards of that point. In other words, the radial width RW may be a length in the radial direction (i.e. the x-direction depicted in FIGS. 4B and 4C). The radial distance at which the step occurs on the patterned edge will vary depending on which point of the edge is being looked at.

The radial width RW is the radial length of the patterned edge in the radial direction. The radial width RW may be determined as the distance in the radial direction between a point which is the most radially outward point (e.g. $X_5$ in FIG. 4C) along a radial path where there is a step (i.e. sharp increase) in photosensitive material on the surface of the substrate W, and a point which is the most radially inward point (e.g. $X_1$ in FIGS. 4B and 4C) where there is a step (i.e. sharp increase) in photosensitive material on the surface of the substrate W. There is substantially no photosensitive material radially outward of the most radially outward sharp step (e.g. $X_5$ in FIG. 4C). Radially inward of the most radially inward sharp step (e.g. $X_1$ in FIGS. 4B and 4C), the remaining layer of photosensitive material 5 is substantially flat. In other words, the radial width RW may be a distance in the radial direction from the outermost thickness change (which goes from substantially zero to a thickness substantially the same as the remaining layer of photosensitive material 5 on the surface of the substrate W) to an innermost thickness change (which goes from substantially zero to a thickness substantially the same as the remaining layer of photosensitive material 5 on the surface of the substrate W).

The remaining layer of photosensitive material 5 may be considered to be substantially flat when the variation of the surface of the remaining layer of photosensitive material 5 is approximately less than or equal to 1% of the surface thickness. The thickness (i.e. distance in the z-direction in FIGS. 4A to 4E) may be determined to be the average thickness of the remaining layer of photosensitive material 5 when it is considered to be substantially flat, i.e. as depicted in FIG. 4A.

In an embodiment, removing photosensitive material from around the outer edge of the layer of photosensitive material 5 comprises directing radiation from a laser to be incident on the photosensitive material around the outer edge of the layer of photosensitive material 5. The removing using the directed radiation from a laser is controlled so as to generate variation in the thickness profile along the length of the edge. For example, this may form a rough edge or a patterned edge as described above.

Alternatively, the removing comprises an initial removal step for removing photosensitive material around the outer edge of the layer of photosensitive material 5, and further comprises directing radiation from a laser to be incident on the photosensitive material to remove further photosensitive material from around the remaining layer of photosensitive material 5 so as to generate the edge. In this embodiment, the initial step may be carried out by a variety of methods, including methods in any of the embodiments described herein. The initial step of removal could be carried out using any known method which may result in a remaining layer of photosensitive material 5 on the surface of the substrate W without the above described edge as depicted in FIG. 2. The removing of further photosensitive material using the directed radiation from a laser is controlled so as to generate variation in the thickness profile along the length of the edge. For example, this may form a rough edge or a patterned edge as described above.

The radiation incident on the photosensitive material may be used to evaporate photosensitive material around the edge of the layer of photosensitive material 5. The evaporated photosensitive material may then be removed, for example, by an extractor 93 depicted in FIG. 9. The extractor 93 may be provided with any of the other embodiments in order to extract removed photosensitive material. The extractor 93 may be interchangeable with other means for removing evaporated photosensitive material from around the substrate W.

The type of laser used for providing the radiation is not particularly limited. The radiation is provided as a radiation beam as described below. The laser in any of the embodiments may be a $CO_2$-laser, a Nd:YAG laser, a frequency-doubled or frequency-tripled Nd:YAG laser, an excimer laser, a semiconductor-diode laser or a diode-pumped solid state laser may, for example. The wavelength of the radiation provided by the laser may be adapted to the properties of the photosensitive material to be removed.

Figure 9:
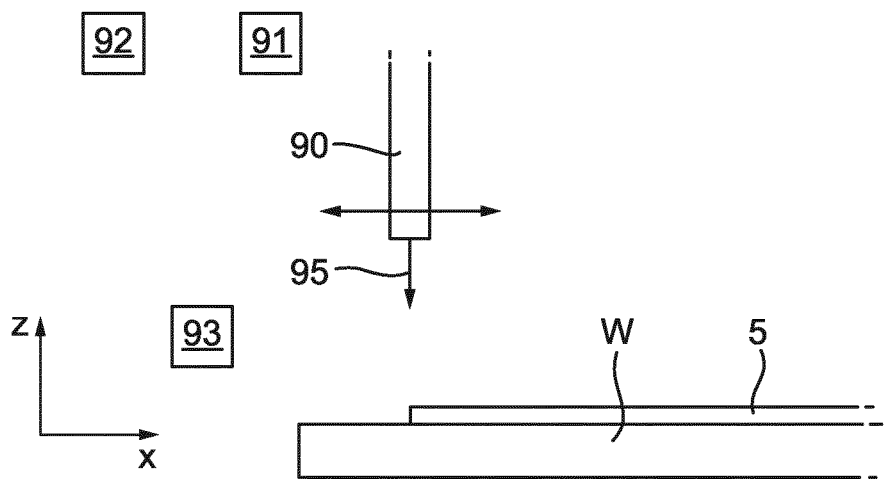
FIG. 9 is a schematic illustration of a side view of a portion of a substrate and a laser, according to an embodiment.

In an embodiment, the method includes using a laser to provide a radiation beam which is incident on the photosensitive material. The method may include oscillating the radiation beam 95 so as to generate the edge which has a varying thickness profile along the length of the edge and the laser may be referred to as an oscillating laser 90, as depicted in FIG. 9. In other words, the radiation incident on the photosensitive material may be moved back and forth in a regular manner. This may be done using optical means, for example, the radiation beam 95 may be directed to the surface using one or more mirrors which can be moved, for example, by means/a system including at least one piezo actuator; or the mirrors can scan the radiation beam 95 over the region of the substrate W and/or the layer of photosensitive material 5 as desired. Alternatively, the radiation beam 95 could be coupled into an optical fibre and guided towards the substrate W, where the optical fibre, and optionally an associated optical focussing element and the substrate W can be moved relative to one another. The optical fibre maybe controlled by one or more actuators, e.g. a piezo actuator. The mechanical or optical systems may be combined in any appropriate manner in order to move the laser beam and the substrate W relative to one another. A controller 91 may be provided to control oscillation of the radiation beam 95. In an embodiment, oscillating the radiation beam 95 in this way may circumferentially modulate the edge of the layer of photosensitive material 5. For example, the radiation beam 95 may be oscillated to form a patterned edge, for example, such that the shape of the edge is similar to a sinusoidal wave, triangular wave, square wave or rectangular wave as described above. Using the oscillating laser 90 may have the same advantages as using the oscillating nozzle 10 as described above. The oscillating laser 90 may have additional advantages associated with being able to produce a patterned edge.

The radiation beam 95 may be oscillated back and forth on the substrate W and/or the layer of photosensitive material 5 in plan view. The back and forth motion of the radiation beam 95 is depicted by arrows in FIG. 9. This may mean that the oscillating laser 90 is above the substrate W and/or the layer of photosensitive material 5 during the oscillation of the radiation beam 95, or it may mean that the oscillating laser 90 is located elsewhere (not shown) and the radiation beam 95 is directed to the surface of the substrate W and/or the layer of photosensitive material 5, for example using optical or mechanical systems as described above.

In an embodiment, the method includes oscillating radiation beam 95 in a substantially radial direction. As the substrate W may rotate whilst the oscillation occurs, the relative movement between the radiation beam 95 incident on the substrate W and/or the layer of photosensitive material 5 and the surface of the substrate W and/or the layer of photosensitive material 5 may appear to form a circular or helical path in a plan view.

In any of the above embodiments, the radiation beam 95 may be continuously oscillating, i.e. the radiation beam 95 continuously moves back and forth above the substrate W. This may mean that the radiation beam 95 is continuously oscillating as long as the radiation beam 95 is incident on any portion of the photosensitive material and/or substrate W.

In any of the above embodiments, the method comprises controlling the frequency and/or amplitude of oscillation of the radiation beam 95 depending on at least one property of the photosensitive material. Controlling the frequency and/or amplitude of oscillation may alter the characteristics of the edge produced around the layer of photosensitive material 5 remaining on the surface of the substrate W. For example, the frequency and/or amplitude of oscillation of the radiation beam 95 may alter the pitch and depth of the features of the edge. Controlling these features of oscillation of the radiation beam 95 can affect the properties of the edge and may thus be controlled to take into account of the effect of the edge, e.g. to take into account resulting defects and/or water loss on the substrate W in order to reduce or avoid defects occurring. In this way, controlling these features of oscillation of the radiation beam 95 may be controlled based on some sort of feedback from at least one sensor and/or processor.

In an embodiment, an indication of the resulting defects and/or water loss on the substrate W may be provided. For example, a measurement unit 92 (as depicted in FIG. 9) may detect and/or measure the resulting defects and/or water loss on the substrate W after exposure of the substrate W in a lithographic apparatus and provide the indication of the resulting defects and/or water loss on the substrate W. The measurement unit 92 may alternatively measure the profile of the edge to determine/predict an indication of the resulting defects and/or water loss on the substrate W. The measurement unit 92 may be used offline (i.e. after exposure) and may only use test substrates W. The measurement unit 92 may be the same as the measurement unit 80 depicted in FIG. 5 in relation to the oscillating nozzle 10. The measurement unit 92 may be external to the apparatus used in any of the above embodiments, for example, the measurement unit 92 may be part of a lithographic apparatus. In an embodiment, the measurement unit 92 may send control signals to, or receive control signals from, the controller 91. The measurement unit 92 is depicted as an external unit in FIG. 9, which may communicate with the embodiments as described above. The measurement unit 92 could be provided to communicate with embodiments as depicted in any of FIGS. 10-13B and 18, or may not be provided to communicate with in the embodiment depicted in FIG. 9.

It may be determined that a change is required in the radiation beam 95, for example, the amplitude, frequency and/or power of the radiation beam 95 may be changed. The controller 91 may be used to determine the change required and change the characteristic of the radiation beam 95. Alternatively, the controller 91 may receive input from the measurement unit 92 indicating the change for controlling the radiation beam 95. An indication of the effect of the change on the resulting defects and/or water loss on the substrate W may be provided, for example by the measurement unit 92 described above, to determine if a further change is desirable.

In an embodiment, controlling the frequency of oscillation of the radiation beam 95 includes controlling the frequency within a predetermined range of frequencies. Controlling the oscillation of the radiation beam 95 within a predetermined range may control a wavelength of the rough edge, i.e. the frequency of oscillation can be altered to modulate/adjust the wavelength of the rough edge. If the edge is a rough edge, then the wavelength is the distance between features, as described above in relation to the example with relatively large vortex structures above. However, if the edge is patterned, then the wavelength relates to the length for a period of the wave as would be normally understood. The wavelength could be understood to mean the distance between consecutive corresponding points, e.g. the distance between two crests, or the distance between two troughs. Therefore, the shape of the edge, i.e. the thickness variation in the circumferential direction, may be altered and controlled by controlling the frequency of oscillation of the radiation beam 95. This may allow the frequency of oscillation to be controlled to affect the shape of the edge which may lead to defects being reduced or avoided. In an embodiment, the frequency is approximately less than or equal to approximately 500 kHz, or preferably less than or equal to approximately 100 kHz, or more preferably less than or equal to approximately 50 kHz. In an embodiment, the frequency is approximately greater than or equal to approximately 500 Hz, or preferably greater than or equal to approximately 1 kHz, or more preferably greater than or equal to approximately 10 kHz.

In an embodiment the frequency of oscillation of the radiation beam 95 is controlled so that the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the frequency of oscillation of the radiation beam 95 is controlled so that the typical wavelength is greater than or equal to approximately 10 μm, or preferably greater than or equal to approximately 50 μm, or more preferably greater than or equal to approximately 0.1 mm Controlling the frequency of oscillation to generate an edge with a wavelength with these values, in particular the preferable and more preferable values, may mean that the defects can be reduced or even avoided.

In an embodiment, the method comprises controlling the amplitude of oscillation of the radiation beam 95 within a predetermined range of amplitudes to control a radial width RW of the edge. Controlling the amplitudes of the radiation beam 95 within a predetermined range may control a radial width RW of the edge, i.e. the amplitude of oscillation can be altered to modulate/adjust the width of the edge in the radial direction. Therefore, the shape of the edge may be altered and controlled by controlling the amplitude of oscillation of the radiation beam 95. The resulting shape of the edge may allow the amplitude of oscillation of the radiation beam 95 to be controlled to reduce or even avoid defects.

In an embodiment the amplitude of oscillation of the radiation beam 95 is controlled so that the radial width RW is less than or equal to approximately 2 mm, or preferably less than or equal to approximately 0.5 mm, or more preferably less than or equal to approximately 0.3 mm. In an embodiment, the amplitude of oscillation of the radiation beam 95 is controlled so that the radial width RW is greater than or equal to approximately 10 μm, or preferably greater than or equal to approximately 50 μm, or more preferably greater than or equal to approximately 0.1 mm Controlling the amplitude of oscillation to generate an edge with a radial width RW with these values, in particular the preferable and more preferable values, may reduce or avoid defects as described.

In an embodiment, the amplitude of oscillation of the radiation beam 95 is approximately less than or equal to approximately 2 mm, or preferably less than or equal to approximately 0.5 mm, or more preferably less than or equal to approximately 0.3 mm. In an embodiment, the amplitude of oscillation of the radiation beam 95 is approximately greater than or equal to approximately 10 μm, or preferably greater than or equal to approximately 50 μm, or more preferably greater than or equal to approximately 0.1 mm.

In an embodiment, the method comprises oscillating the radiation beam 95 at a predetermined frequency. The method may further comprise rotating the substrate W at a first frequency and oscillating the radiation beam 95 at a second frequency. Rotating the substrate W at a first frequency may include providing the substrate W on a substrate support 7 and controlling rotation of the substrate support 7 around the axis of the substrate W. The method may comprise rotating the substrate W at hundreds or thousands of revolutions per minute. The second frequency may be higher than the first frequency. The second frequency may be significantly higher than the first frequency. In this context, significantly higher may mean that the second frequency is at least 10 times higher than the first frequency, or that the second frequency is at least 100 times higher than the first frequency, or that the second frequency is at least 1000 times higher than the first frequency.

Figure 10:
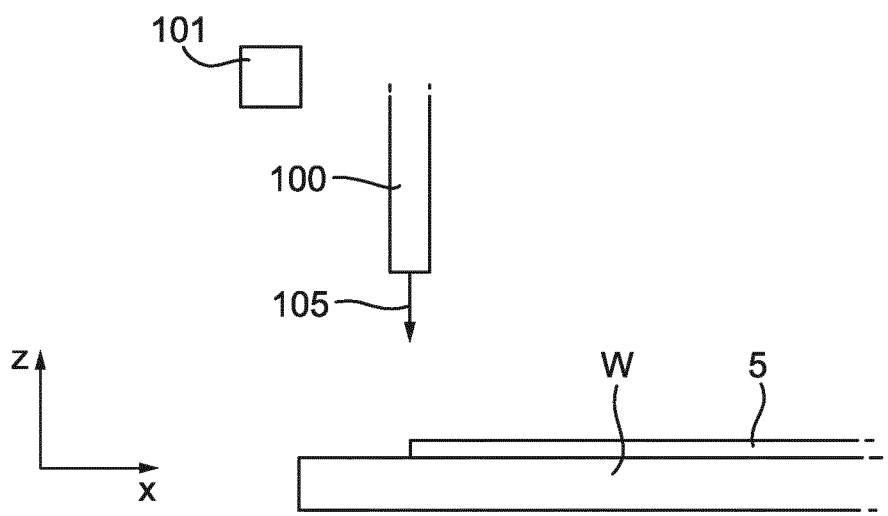
FIG. 10 is a schematic illustration of a side view of a portion of a substrate and a laser, according to an embodiment.

In any of the above embodiments relating to the use of a laser, the method may comprise pulsing the laser. This embodiment is depicted in FIG. 10. In other words, the radiation beam 105 from laser 100 is incident on the substrate W and/or the layer of photosensitive material 5 in a pulsed manner, in that over a period of time, the radiation beam 105 is essentially in an "on" or "off" state. The "on" state being when the radiation beam 105 is directed to, i.e. incident on, the substrate W and/or the layer of photosensitive material 5 and the "off" state being when the radiation beam 105 is not directed to, i.e. is not incident on, the substrate W and/or the layer of photosensitive material 5. This may be controlled by turning the laser 100 on and off. This may be controlled by providing a constant radiation beam 105 from the laser 100, but preventing the radiation beam 105 from reaching the surface of the substrate W and/or the layer of photosensitive material 5 during the "off" state periods. For example, a physical barrier may be used, such as a rotating disc with a hole to allow radiation to pass through.

The "on" state may be provided at any frequency which adequately generates the edge as described above. For example only, the frequency of the "on" state may be of the order of 1 Hz up to hundreds of kHzs, or even MHzs, for example, the frequency may be between approximately 10 kHz to 1 MHz, although this is not necessarily the case. The frequency may be varied depending on the relative movement between the radiation beam 105 and the substrate W and/or the layer of photosensitive material 5, the wavelength of the radiation beam 105 and the power of the laser 100. The frequency may be varied to obtain the edge as described above.

In this embodiment, the radiation beam 105 incident on the surface of the substrate W and/or the layer of photosensitive material 5 is moved relative to the surface of the substrate W and/or the layer of photosensitive material 5. For example, there may be relative movement between each pulse, or between a set number of pulses. In an embodiment, the laser 100 is moved relative to the substrate W. In this way, different pulses of the radiation beam 105 will be incident on different portions of the photosensitive material, thus removing different portions of the layer photosensitive material 5 and generating the edge.

In this embodiment, the method may comprise controlling the pulsing the laser 100 depending on at least one property of the photosensitive material. A controller 101 may be provided to control the pulses of the radiation beam 105 from the laser 100. The controller 101 may be the same as any of the controllers previously described. Although the controller 101 is shown as external to the laser 100, the controller 101 may be integrated with the laser 100.

The pulses of the radiation beam 105 may be controlled to have a fixed "on" and "off" state. The pulses of the radiation beam 105 may be at regular intervals. The "on" and "off" states of the pulsed radiation beam 105 may be equivalent, i.e. the radiation beam 105 may be incident on the substrate W and/or the layer of photosensitive material 5 for the same amount of time as it is not incident on the substrate W and/or the layer of photosensitive material 5. In other words, the duty cycle may be 50%. The frequency of the pulses of the radiation beam 105 is the number of pulses repeating in a specific time unit. In other words, the frequency is the number of times the radiation beam 105 is turned to an "on" state in a specific time unit. The amount of time that the radiation beam 105 is incident on the surface of the substrate W and/or the layer of photosensitive material 5 may depend on the power of the laser 100. For example, the radiation beam 105 may be in an "on" state for longer if the power of the laser 100 is reduced.

In an embodiment, controlling the frequency of pulses of the radiation beam 105 from the laser 100 includes controlling the frequency within a predetermined range of frequencies. Controlling the frequency of pulses of the radiation beam 105 within a predetermined range may control a wavelength of the edge, i.e. the frequency can be altered to modulate/adjust the wavelength of the edge. The wavelength may be interpreted as described above for a rough edge or a patterned edge as applicable. Therefore, the shape of the edge may be altered and controlled by controlling the frequency of pulses of the radiation beam 105. This may allow the frequency of pulses to be controlled to shape the edge such that defects may be reduced or even avoided. In an embodiment, the frequency is approximately less than or equal to approximately 500 kHz, or preferably less than or equal to approximately 100 kHz, or more preferably less than or equal to approximately 50 kHz. In an embodiment, the frequency is approximately greater than or equal to approximately 500 Hz, or preferably greater than or equal to approximately 1 kHz, or more preferably greater than or equal to approximately 10 kHz.

In an embodiment the frequency of pulses of the radiation beam 105 from the laser 100 are controlled so that the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the frequency of pulses of the radiation beam 105 from the laser 100 is controlled so that the typical wavelength is greater than or equal to approximately 10 µm, or preferably greater than or equal to approximately 50 µm, or more preferably greater than or equal to approximately 0.1 mm Controlling frequency of pulses of the radiation beam 105 from the laser 100 to generate an edge with a wavelength with these values, in particular the preferable and more preferable values, may mean that the defects can be reduced or even avoided.

In this embodiment, the method comprises pulsing the radiation beam 105 from laser 100 at a predetermined frequency. The method may further comprise rotating the substrate W at a first frequency and pulsing the radiation beam 105 at a second frequency. Rotating the substrate W at a first frequency may include providing the substrate W on a substrate support 7 and controlling rotation of the substrate support 7 around the axis of the substrate W. The method may comprise rotating the substrate W at hundreds or thousands of revolutions per minute. The second frequency may be higher than the first frequency. The second frequency may be significantly higher than the first frequency. In this context, significantly higher may mean that the second frequency is at least 10 times higher than the first frequency, or that the second frequency is at least 100 times higher than the first frequency, or that the second frequency is at least 1000 times higher than the first frequency.

In an embodiment, the method may comprise controlling the width of the radiation beam 105 from laser 100 incident on the substrate W and/or the layer of photosensitive material 5 within a predetermined range to control a radial width RW of the edge around the layer of photosensitive material 5 remaining on the surface of the substrate W. As described above, controlling the shape of the edge, e.g. the radial width RW of the edge, around the layer of photosensitive material 5 can affect defects on the surface of the substrate W and thus may be controlled to reduce errors described above. This may allow the width of the radiation beam 105 from laser 100 incident on the substrate W and/or the layer of photosensitive material 5 to be controlled to reduce or even avoid defects.

In an embodiment, the width of the radiation beam 105 from laser 100 incident on the substrate W and/or the layer of photosensitive material 5 is controlled so that the radial width RW of the edge is less than or equal to approximately 3 mm, or preferably less than or equal to approximately 2 mm, or more preferably less than or equal to approximately 0.5 mm. In an embodiment, the width of the radiation beam 105 from laser 100 incident on the substrate W and/or the layer of photosensitive material 5 is controlled so that the radial width RW of the edge is greater than or equal to approximately 0.01 mm, or preferably greater than or equal to approximately 0.05 mm, or more preferably greater than or equal to approximately 0.1 mm. Controlling the width of the radiation beam 105 from laser 100 incident on the substrate W and/or the layer of photosensitive material 5 to generate an edge with a radial width RW with these values, in particular the preferable and more preferable values, may reduce or even avoid defects due to the edge of the remaining layer of the photosensitive material 5.

In an embodiment, an indication of the resulting defects and/or water loss on the substrate W may be provided. The indication of the resulting defects and/or water loss on the substrate W may be provided using the measurement unit 92 as described above, for example with the embodiments depicted in FIG. 9. However, in this embodiment, the measurement unit 92 may send control signals to, or receive control signals from, the controller 101. From using the indication received from the measurement unit 92 as described above, it may be determined that a change is required in the radiation beam 105 from the laser 100, for example, the frequency of the pulses and/or intensity of the radiation etc. The controller 101 may be used to determine the change required and change the characteristic of the radiation beam 105. Alternatively, the controller 101 may receive input from measurement unit 92 indicating the change for controlling the radiation beam 105. An indication of the effect of the change on the resulting defects and/or water loss on the substrate W may be provided, for example using the measurement unit 92 described above, to determine if a further change is desirable.

The radiation beam 105 may be the same as radiation beam 95, and the laser 100 may be the same as laser 90. As such, the laser 90 used to provide an oscillating radiation beam 95 may also be used to provide a pulsed radiation beam 105. Therefore, the radiation beam 105 may be configured to oscillate and pulse, optionally at the same time.

In any of the above embodiments relating to a laser, the method may further comprise providing a patterning device. In this embodiment, the patterning device may be used to in some way pattern the radiation beam incident on the substrate W and/or the layer of photosensitive material 5. In an embodiment, the radiation beam may reflect from the patterning device. In an embodiment, the radiation beam may pass through the patterning device.

In an embodiment, the patterning device may be moved relative to the substrate W to generate the edge as described above. For example, the patterning device may be moved around the outside of the substrate W in order to redirect radiation from the laser. The patterning device may direct some but not all the radiation towards the substrate W and/or or the layer of photosensitive material 5. The patterning device may alter the intensity of the radiation beam.

In an embodiment, relative movement of the patterning device may be controlled depending on at least one property of the photosensitive material. In an embodiment, the relative movement of the patterning device may be controlled so that the wavelength of the edge is within a desired range. The wavelength may be interpreted as described above for a rough edge or a patterned edge as applicable. In an embodiment, the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the movement of the patterning device is controlled so that the typical wavelength is greater than or equal to approximately 10 μm, or preferably greater than or equal to approximately 50 μm, or more preferably greater than or equal to approximately 0.1 mm. Controlling the movement of the patterning device to generate an edge as described above with a wavelength with these values, in particular the preferable and more preferable values, may mean that defects can be reduced or even avoided.

Figure 11A:
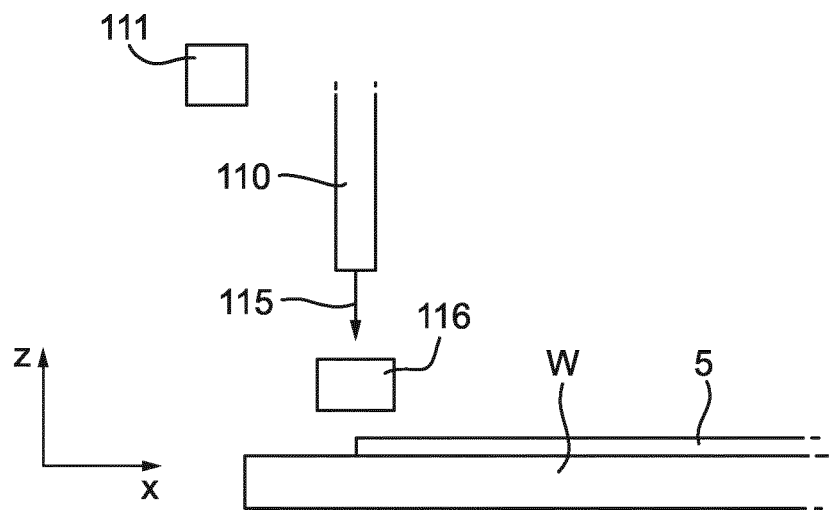
FIG. 11A is a schematic illustration of a side view of a portion of a substrate and a laser, according to an embodiment, wherein a patterning device is provided.

In an embodiment, relative movement of the patterning device is controlled so that the radial width RW is less than or equal to approximately 2 mm, or preferably less than or equal to approximately 0.5 mm, or more preferably less than or equal to approximately 0.3 mm. In an embodiment, relative movement of the patterning device is controlled so that the radial width RW is greater than or equal to approximately 10 μm, or preferably greater than or equal to approximately 50 μm, or more preferably greater than or equal to approximately 0.1 mm Controlling the relative movement of the patterning device to generate an edge as described above with a radial width RW with these values, in particular the preferable and more preferable values, may reduce or avoid defects as described In an embodiment, the patterning device is a shaped mask 116. The shaped mask 116 may otherwise be referred to as a geometric mask. As shown in FIG. 11A, laser 110 emits radiation beam 115 which is directed towards the substrate W and/or the layer of photosensitive material 5. The radiation beam 115 is directed to the substrate W and/or the layer of photosensitive material 5 and the shaped mask 116 prevents or reduces radiation around a certain portion of the shaped mask 116 from reaching the substrate W and/or the layer of photosensitive material 5.

Figure 11B:
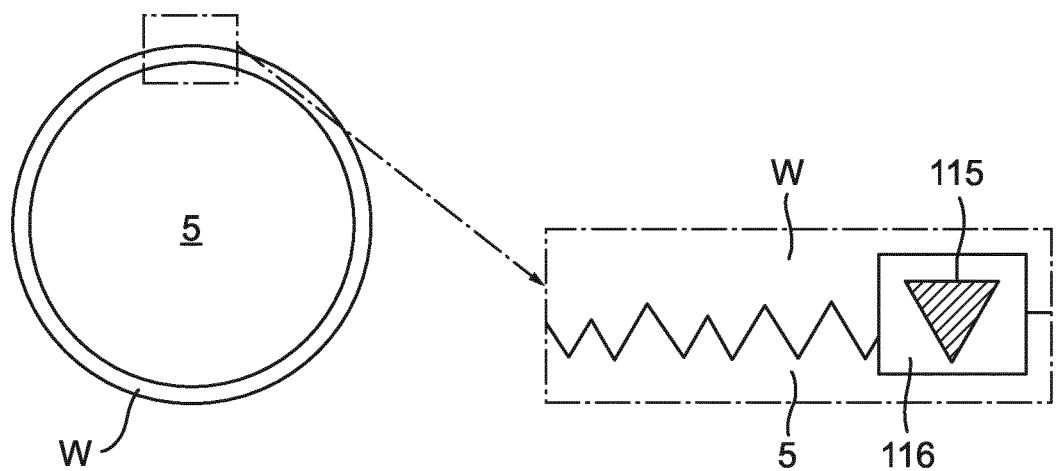
FIG. 11B is a schematic illustration of a plan view of the substrate and the patterning device.

The shaped mask 116 may be a mask inserted into the cross section of the radiation beam 115, which, for example, prevents (or reduces) radiation reaching the substrate W and/or the layer of photosensitive material 5 except for through a particular shaped hole such that only radiation through the shaped hole would reach the substrate W. Generating the edge using a shaped mask 116 is depicted in FIGS. 11A and 11B. As shown the shaped mask 116 allows the radiation beam 115 to pass through it in the shape of a triangle in plan view, i.e. the radiation beam 115 is shaped by the shaped mask 116. The shaped mask 116 may be any desired shape to achieve a desired thickness profile around the edge. The shaped mask 116 may have a shaped hole with a pattern or repeated shape rather than a single shape as shown. The shaped mask 116 may have a shaped hole as described and the size of the hole is not particularly limiting. For example, the shaped hole may have a width in the order of 10 s, 100 s, or 1000 s μm.

Movement of the shaped mask 116 may be controlled using a controller 111. The controller 111 maybe the same type of same controller as described in any of the above embodiments. The laser 110 and radiation beam 115 may be the same as other lasers and radiation beams respectively as previously described. Thus, the shaped mask 116 may be provided in addition with the oscillating and/or pulsing radiation beam embodiments described above.

In an embodiment, the shaped mask 116 of FIGS. 11A and 11B may be replaced with a transmissive patterned mask or a reflective patterned mask. A transmissive patterned mask is configured to allow some radiation to pass through transmissive portions. The transmissive patterned mask also prevents some radiation from passing through the transmissive patterned mask. Thus, for example, a pattern is formed in a cross section of the radiation beam 115. The reflective patterned mask, on the other hand, is configured to allow some radiation to be reflected from reflective portions. The reflective patterned mask prevents some radiation from being reflected from the reflective pattern. In this way, a pattern can be formed in a cross section of the radiation beam 115. Thus, both the reflective patterned mask and the transmissive patterned mask may form a pattern in the cross section of the radiation beam 115, however, with the reflective patterned mask, the radiation beam 115 is reflected from the reflective patterned mask whereas with the transmissive mask, the radiation beam 115 passes through it.

Figure 12A:
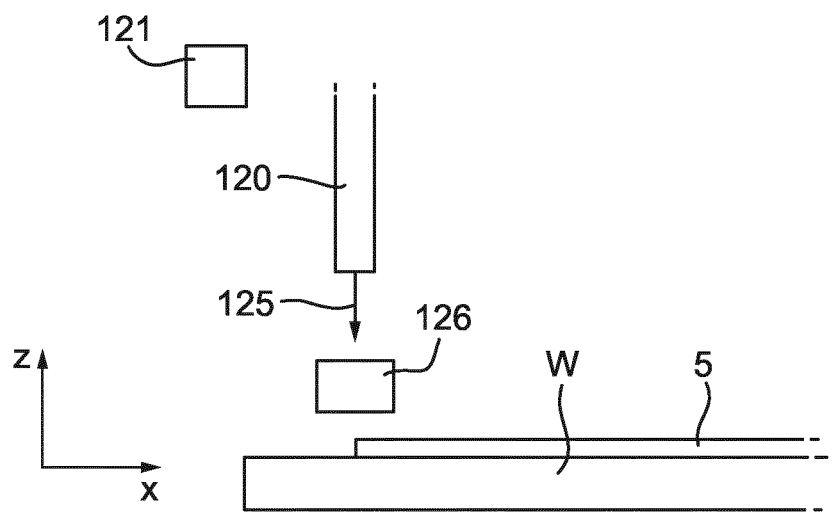
FIG. 12A is a schematic illustration of a side view of a portion of a substrate and a laser, according to an embodiment, wherein a patterning device is provided.

In an embodiment, the patterning device is a transmissive diffraction grating 126 (otherwise known as an interference grating) instead of the shaped mask 116, i.e. the shaped mask 116 as described above can be replaced by a transmissive diffraction grating 126. Generating the edge using the transmissive diffraction grating 126 is depicted in 12A and 12B. As shown in FIG. 12A, laser 120 emits radiation beam 125 which is directed towards the substrate W and/or the layer of photosensitive material 5 to generate the edge. The radiation beam 125 is passed through the transmissive diffraction grating 126. Thus the radiation beam 125 is spatially modulated. Interaction and overlap of the spatially modulated radiation beam 125 at the edge of the remaining layer of photosensitive material 5 generates the edge described above having the varying thickness profile in the circumferential direction.

Figure 12B:
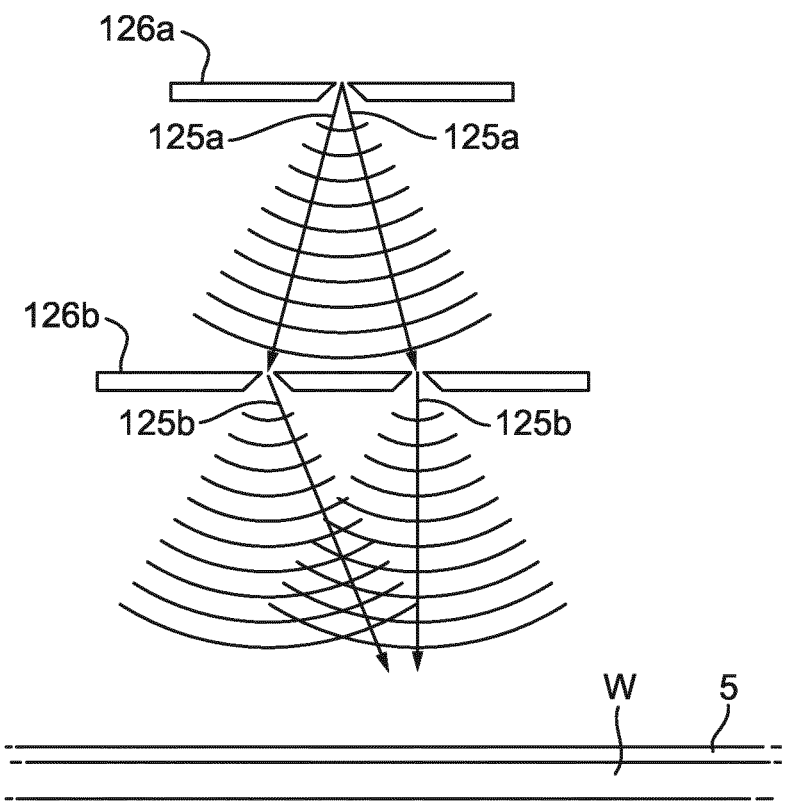
FIG. 12B is a schematic illustration of a plan view of the substrate and the patterning device.

The transmissive diffraction grating 126 comprises at least one surface with multiple slits having a predetermined distance between the slits. As depicted in FIG. 12B, the transmissive diffraction grating 126 comprises a first grating 126a and a second grating 126b. Either of the first grating 126a or the second grating 126b comprises a surface with multiple slits having a predetermined distance between the slits. The radiation beam 125 passes through the transmissive diffraction grating 126 and the radiation beam 125 splits into radiation beams 125a when passing through the multiple slits in the first grating 126a of the transmissive diffraction grating 126. The split radiation beams 125a then pass through the multiple slits in the second grating 126b of the transmissive diffraction grating 126 and resulting radiation beams 125b are directed towards the substrate W and/or the layer of photosensitive material 5. The directions of the radiation beams 125a and 125b may depend on at least the spacing of the slits through which the radiation passes on the first grating 126a and second grating 126b and the wavelength of the radiation beam 125. The spacing of the slits is a predetermined distance which is selected depending on at least one property of the photosensitive material.

The type of gratings used may be any commercial grating. As an example only, at least one of the first gratings 126a and/or the second grating 126b may have approximately 300 slits per mm and the radiation beam 125 may have a wavelength of approximately 355 nm and the transmissive diffraction grating 126 may be at a distance of approximately 450 μm from the surface of the substrate W. The number of slits per mm may depend on the positioning and wavelength of the radiation beam 125 relative to the transmissive diffraction grating 126. The wavelength of the radiation beam 125, predetermined distance between the slits, distance between the first grating 126a and the second grating 126b, and the distance between the transmissive diffraction grating 126 and the surface of the substrate W may be varied and these variables may affect one another. Constructive interference between the split radiation beams, e.g. 125b, occurs at certain radii. Therefore, by matching the interference pattern to the desired shape of the edge, the edge thickness can be controlled. In this way, a periodically modulated pattern may be obtained around the edge, if desired.

Movement of the transmissive diffraction grating 126 may be controlled using a controller 121. The controller 121 maybe the same type of same controller as described in any of the above embodiments. The laser 120 and radiation beam 125 may be the same as other lasers and radiation beams respectively previously described. Thus, the transmissive diffraction grating 126 may be provided to replace any of the other patterning devices described above, or in addition to the oscillating and/or pulsing radiation beam embodiments described above.

Figure 13A:
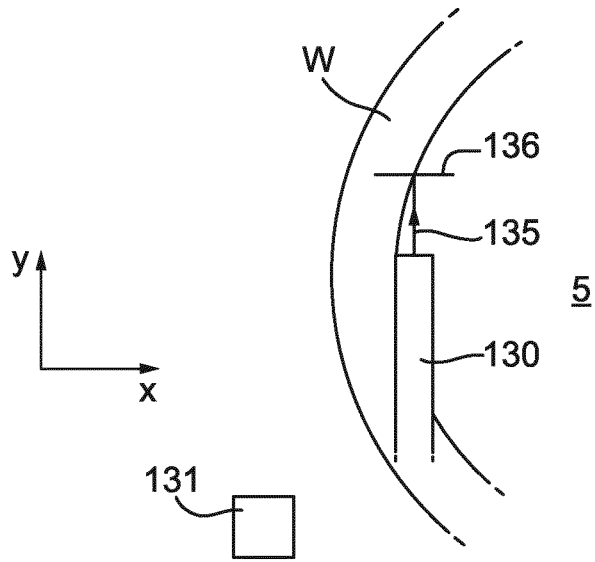
FIG. 13A is a schematic illustration of a side view of a portion of a substrate and a laser, according to an embodiment, wherein a patterning device is provided.
Figure 13B:
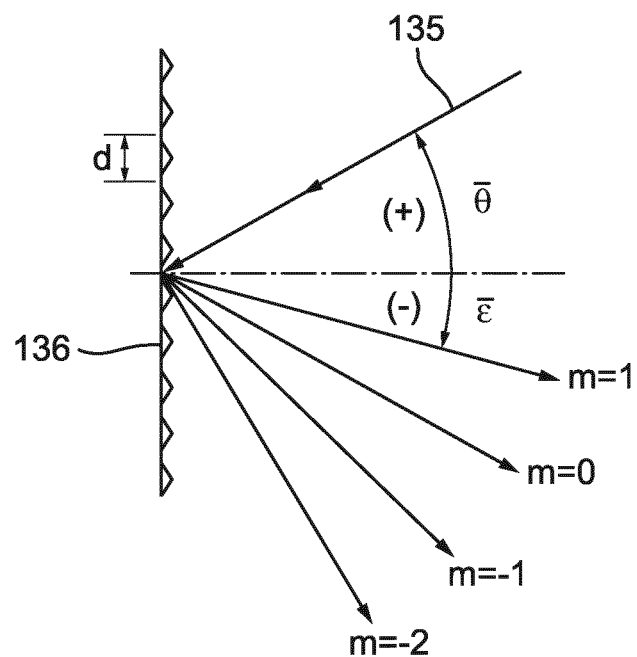
FIG. 13B is a schematic illustration of a plan view of the substrate and the patterning device.

In an embodiment, the patterning device may be a reflective diffraction grating 136 instead of the shaped mask 116, i.e. the shaped mask 116 as described above can be replaced by a reflective diffraction grating 136. Generating the edge using the reflective diffraction grating 136 is depicted in FIGS. 13A and 13B. The reflective diffraction grating 136 may comprise at least one surface with multiple grooves having a predetermined distance between the grooves. The predetermined distance may be selected depending on at least one property of the photosensitive material. As shown in FIG. 13A, laser 130 emits radiation beam 135 which is directed towards the substrate W and/or the layer of photosensitive material 5. The radiation beam 135 is reflected from the reflective diffraction grating 136. Thus the radiation beam 135 is spatially modulated. Interaction and overlap of the spatially modulated radiation beam 135 at the edge of the remaining layer of photosensitive material 5 generates the edge described above having the varying thickness profile in the circumferential direction.

As depicted in FIG. 13B, the radiation beam 135 may be directed towards the reflective diffraction grating 136 at an angle. The angled radiation beam 135 is reflected off the reflective diffraction grating 136 and directed towards the substrate W and/or the layer of photosensitive material 5 to generate the edge. As depicted in FIG. 13B, when the radiation beam 135 is reflected from the reflective diffraction grating 136, the radiation beam splits into several beams, i.e. several orders of the spectrum, labelled in FIG. 13B as m=1, m=0, m=−1, m=−2.

As described above, the reflective diffraction grating 136 may comprise grooves, e.g. comprising ridges or rulings, on a surface of the reflective diffraction grating 136. The grooves may be at predefined distances from each other, wherein the grooves determine how the radiation beam 135 is split. For example, the predefined distance, which can otherwise be referred to as the period of the grating, may be determined as the distance d in FIG. 13B, for example, as in the distance between each groove on the surface of the reflective diffraction grating 136. The distance d may be selected to split the radiation beam 135 as desired.

Known commercial reflective diffraction gratings may be used. As an example only, a commercial diffraction grating may be used with approximately 300 grooves per mm and the radiation beam 135 may have a wavelength of approximately 355 nm and the reflective diffraction grating 136 may be at a distance of approximately 450 μm from the surface of the substrate W. Other known reflective diffraction gratings may be used and the period may be selected depending on the positioning of the radiation beam 135 relative to the reflective diffraction grating 136 and the wavelength of the radiation beam 135. The wavelength of the radiation beam 135, predetermined distance between the grooves, and the distance between the reflective diffraction grating 136 and the surface of the substrate W may be varied and these variables may affect one another.

The split radiation beam with different m values will have varying intensities. Changing the incoming angle θ of the radiation beam 135 will alter the angles of the split radiation beam 135, for example angle E for the m=1 beam. Varying these angles can be used to control how the radiation beam 135 falls on the surface of the substrate W and/or the layer of photosensitive material 5 to achieve the edge as described above. The position of the reflective diffraction grating 136 relative to the laser 130, radiation beam 135 and surface of the substrate W and/or the layer of photosensitive material 5 may be altered to achieve the desired edge. Constructive interference between the split radiation beams occurs at certain radii. Therefore, by matching the interference pattern to the desired shape of the edge, the edge thickness can be controlled. In this way, a periodically modulated pattern may be obtained around the edge, if desired.

Movement of the reflective diffraction grating 136 may be controlled using a controller 131. The controller 131 maybe the same type of same controller as described in any of the above embodiments. The laser 130 and radiation beam 135 may be the same as other lasers and radiation beams respectively previously described. Thus, the reflective diffraction grating 136 may be provided to replace any of the other patterning devices described above, or in addition to the oscillating and/or pulsing radiation beam embodiments described above.

In any of the above embodiments relating to the use of a laser for generating the edge, the cross sectional area of the radiation beam incident on the substrate W and/or the layer of photosensitive material 5, e.g. the width of the radiation beam, may be controlled depending on at least one property of the photosensitive material. Controlling the radiation beam may alter the characteristics of the edge produced around the layer of photosensitive material 5 remaining on the surface of the substrate W. For example, the width and/or intensity of the radiation beam incident on the surface of the substrate W and/or the layer of photosensitive material 5 may alter the pitch and depth of the features of the edge, i.e. may alter the structure such that the edge has a desired structure. The structure may have circumferential and radial contact angle/height variations, e.g. due to patterning or roughness as described above. Thus, controlling the radiation beam can affect the properties of the edge and may thus be controlled to take into account of the effect of the edge, e.g. to take into account resulting defects and/or water loss on the substrate W in order to reduce or avoid defects occurring. In this way, controlling the radiation beam may be controlled based on some sort of feedback from at least one sensor and/or processor. In any of the above embodiments relating to the use of a laser, the position of the laser may be controlled to control the direction of the radiation beam as it reaches the substrate W. The position may be controlled to control which part of the layer of photosensitive material 5 that the radiation beam affects. The position may be controlled, for example, by tilting the laser to alter the direction of the radiation which slightly alters the shape of the radiation beam incident on the surface of the substrate W and/or the layer of photosensitive material 5.

In an embodiment, removing photosensitive material from around the outer edge of the layer of photosensitive material 5 comprises using plasma around the outer edge of the layer of photosensitive material 5 as described in the embodiments below. This may be carried out after an initial removal step as described in some of the above embodiments. Atmospheric plasma discharges, which are a combination of a gas flow and a high electric field, can offer a reactive environment that can remove photosensitive material. The plasma can be controlled by controlling various different properties of the plasma. Although the term plasma is referred to in the presently described embodiments, it will be understood that the reference to plasma may refer to the plasma itself and/or a plasma discharge. For example, by tuning the frequency, voltage, gas composition, pressure, flow rate and/or electrode geometry, the properties of the plasma can be controlled. Depending on the specific design and application, atmospheric plasma devices can be configured to provide erratic gas discharges or localized plasma jets which may both be used for removing photosensitive material whist generating variation in the thickness profile along the length of the edge of the layer of photosensitive material 5. By tuning the gas (for example adding chemical species) and the plasma settings, the process can be used for etching, ashing/oxidation or (local) surface modification (roughening or deposition). Further information on atmospheric plasma discharges is provided in "A review of recent applications of atmospheric pressure plasma jets for materials processing", J. Coatings Technology and Research (2015), by O. V. Penkov et al, and also in "The Atmospheric-Pressure Plasma Jet: A Review and Comparison to Other Plasma Sources", IEEE Transactions on Plasma Science (1998), by Schütze et al.

The atmospheric plasma discharge can be used to remove photosensitive material, for example, by etching or ashing. This may involve for example, using a gas mixture including oxide or nitrogen. An example of photosensitive material removal using such a technique has been described in "Photo-resist stripping process using atmospheric micro-plasma system", J. Phys D (2009), by H. H. Chen et al, in "Localized Removal of a Photoresist by Atmospheric Pressure Micro-Plasma Jet Using RF Corona Discharge", Japanese J. Appl. Phys (2002) by H. Yoshiki et al, and in "Etching materials with an atmospheric-pressure plasma jet", Plasma Sources Sci Technol (1998) by J. Y. Jeong et al. The substrate W may be rotated under the discharged plasma as described in U.S. Pat. No. 6,238,587 B1, but in the present embodiment the plasma is specifically used for photosensitive material removal and edge treatment, and more specifically, to generate variation in the thickness profile along the length of the edge.

As will be described in further detail below, the plasma can be used as a plasma jet and the plasma jet can optionally generate a rough edge or a patterned edge. As will be described, the plasma jet can be controlled in a similar manner to the nozzles and lasers described above, e.g. to provide a rough edge (for example, by combining the plasma jet with oscillations, e.g., similar to the embodiments of FIG. 5 or 9) or to provide a patterned edge.

In an embodiment, the removing of the photosensitive material comprises exposing the photosensitive material around the outer edge of the layer of photosensitive material 5 to a plasma. The plasma may be a localised plasma which may otherwise be referred to as a plasma jet. The plasma jet includes the plasma and/or the plasma discharge. The plasma may be provided by a plasma device. The plasma jet may be a micro-jet, i.e. with very concentrated intensity, and/or the plasma device may generate an array of micro-plasma jets which can be used as the plasma jet described below. The plasma device could otherwise be referred to as a plasma torch, or plasma nozzle. The removing using the plasma jet from a plasma device is controlled so as to generate variation in the thickness profile along the length of the edge. For example, this may form a rough edge or a patterned edge as described above.

Alternatively, the removing comprises an initial removal step for removing photosensitive material around the outer edge of the layer of photosensitive material 5, and further comprises exposing the photosensitive material to a plasma to remove further photosensitive material from around the remaining layer of photosensitive material 5 so as to generate the edge. In this embodiment, the initial step may be carried out by a variety of methods, including methods in any of the embodiments described herein. The initial step of removal could be carried out using any known method which may result in a remaining layer of photosensitive material 5 on the surface of the substrate W without the above described edge as depicted in FIG. 2. The removing of further photosensitive material using the plasma jet from a plasma device is controlled so as to generate variation in the thickness profile along the length of the edge. For example, this may form a rough edge or a patterned edge as described above.

Figure 14:
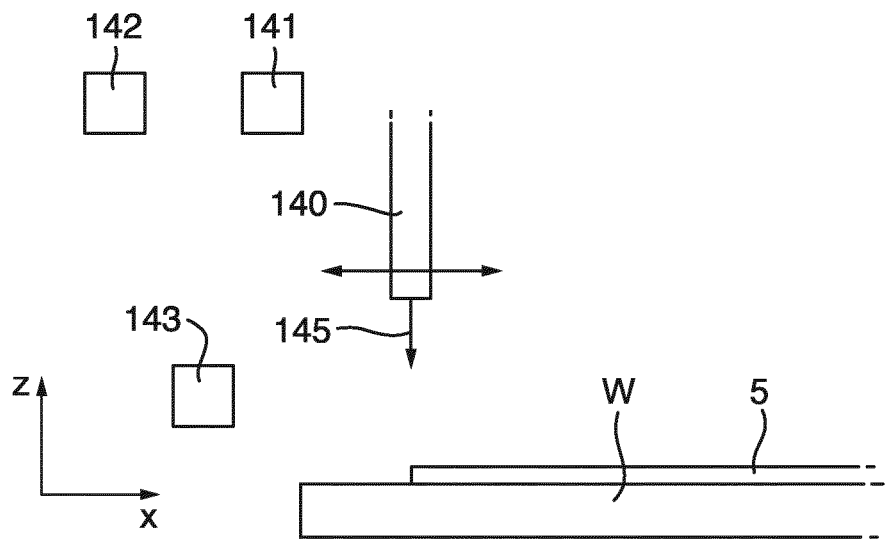
FIG. 14 is a schematic illustration of a side view of a portion of a substrate and a plasma device, according to an embodiment.

As depicted in FIG. 14, a plasma device 140 may emit a plasma jet 145 to which the photosensitive material is exposed. The plasma jet 145 directed to the photosensitive material may be used to change the photosensitive material around the edge of the layer of photosensitive material 5 to ash. This process may be referred to as ashing. The ash may then be removed, for example, by an extractor 143 depicted in FIG. 14. The extractor 143 may also remove products resulting from the ashing, such as photosensitive material oxidation products. The extractor 143 may be provided with any of the other embodiments in order to extract removed photosensitive material. The extractor 143 may be interchangeable with other means for removing photosensitive material from around the substrate W.

The type of plasma used for providing the plasma jet 145 is not particularly limited. Various properties of the plasma can be controlled as described above, for example, the gas composition, pressure, flow rate, voltage, electrode geometry and/or frequency to generate a jet of plasma which can be accurately controlled and adapted depending on the properties of the photosensitive material to be removed.

In an embodiment, the method includes using a plasma device 140 to provide a plasma jet 145 (i.e. localised plasma) which is directed onto the photosensitive material, i.e. such that the photosensitive material is exposed to the plasma. The method may include oscillating the plasma jet 145 so as to generate the edge which has a varying thickness profile along the length of the edge and the plasma device 140 may be referred to as an oscillating plasma device, as depicted in FIG. 14. In other words, the plasma jet 145 incident on the photosensitive material may be moved back and forth in a regular manner. This may comprise moving and/or tilting the plasma device 140 to oscillate the plasma jet 145. A controller 141 may be provided to control oscillation of the plasma jet 145. In an embodiment, oscillating the plasma jet 145 in this way may circumferentially modulate the edge of the layer of photosensitive material 5. For example, the plasma jet 145 may be oscillated to form a patterned edge, for example, such that the shape of the edge is similar to a sinusoidal wave, triangular wave, square wave or rectangular wave as described above. The plasma device 140 may be referred to as the oscillating plasma device and may have the same advantages as using the oscillating nozzle 10 as described above. The plasma device 40 may have additional advantages associated with being able to produce a patterned edge.

The plasma jet 145 may be oscillated back and forth on the substrate W and/or the layer of photosensitive material 5 in plan view. The back and forth motion of the plasma jet 145 is depicted by arrows in FIG. 14. This may mean that the oscillating plasma device 140 is above the substrate W and/or the layer of photosensitive material 5 during the oscillation of the plasma jet 145.

In an embodiment, the method includes oscillating plasma jet 145 in a substantially radial direction. As the substrate W may rotate whilst the oscillation occurs, the relative movement between the plasma jet 145 incident on the substrate W and/or the layer of photosensitive material 5 and the surface of the substrate W and/or the layer of photosensitive material 5 may appear to form a circular or helical path in a plan view.

In any of the above embodiments, the plasma jet 145 may be continuously oscillating, i.e. the plasma jet 145 continuously moves back and forth above the substrate W. This may mean that the plasma jet 145 is continuously oscillating as long as the plasma jet 145 is incident on any portion of the photosensitive material and/or substrate W.

In any of the above embodiments, the method comprises controlling the frequency and/or amplitude of oscillation of the plasma jet 145 depending on at least one property of the photosensitive material. Controlling the frequency and/or amplitude of oscillation may alter the characteristics of the edge produced around the layer of photosensitive material 5 remaining on the surface of the substrate W. For example, the frequency and/or amplitude of oscillation of the plasma jet 145 may alter the pitch and depth of the features of the edge. Controlling these features of oscillation of the plasma jet 145 can affect the properties of the edge and may thus be controlled to take into account of the effect of the edge, e.g. to take into account resulting defects and/or water loss on the substrate W in order to reduce or avoid defects occurring. In this way, controlling these features of oscillation of the plasma jet 145 may be controlled based on some sort of feedback from at least one sensor and/or processor.

In an embodiment, an indication of the resulting defects and/or water loss on the substrate W may be provided. For example, a measurement unit 142 (as depicted in FIG. 14) may detect and/or measure the resulting defects and/or water loss on the substrate W after exposure of the substrate W in a lithographic apparatus and provide the indication of the resulting defects and/or water loss on the substrate W. The measurement unit 142 may alternatively measure the profile of the edge to determine/predict an indication of the resulting defects and/or water loss on the substrate W. The measurement unit 142 may be used offline (i.e. after exposure) and may only use test substrates W. The measurement unit 142 may be the same as the measurement unit 80 depicted in FIG. 5 in relation to the oscillating nozzle 10 or the measurement unit 92 depicted in FIG. 9. The measurement unit 142 may be external to the apparatus used in any of the above embodiments, for example, the measurement unit 142 may be part of a lithographic apparatus. In an embodiment, the measurement unit 142 may send control signals to, or receive control signals from, the controller 141. The measurement unit 142 is depicted as an external unit in FIG. 14, which may communicate with the embodiments as described above. The measurement unit 142 could be provided to communicate with embodiments as depicted in any of FIGS. 15-18, or may not be provided to communicate with in the embodiment depicted in FIG. 14.

It may be determined that a change is required in the plasma jet 145, for example, the amplitude, frequency and/or power of the plasma jet 145 may be changed. The controller 141 may be used to determine the change required and change the characteristic of the plasma jet 145. Alternatively, the controller 141 may receive input from the measurement unit 142 indicating the change for controlling the plasma jet 145. An indication of the effect of the change on the resulting defects and/or water loss on the substrate W may be provided, for example by the measurement unit 142 described above, to determine if a further change is desirable.

In an embodiment, controlling the frequency of oscillation of the plasma jet 145 includes controlling the frequency within a predetermined range of frequencies. Controlling the oscillation of the plasma jet 145 within a predetermined range may control a wavelength of the rough edge, i.e. the frequency of oscillation can be altered to modulate/adjust the wavelength of the rough edge. If the edge is a rough edge, then the wavelength is the distance between features, as described above in relation to the example with relatively large vortex structures above. However, if the edge is patterned, then the wavelength relates to the length for a period of the wave as would be normally understood.

The wavelength could be understood to mean the distance between consecutive corresponding points, e.g. the distance between two crests, or the distance between two troughs. Therefore, the shape of the edge, i.e. the thickness variation in the circumferential direction, may be altered and controlled by controlling the frequency of oscillation of the plasma jet 145. This may allow the frequency of oscillation to be controlled to affect the shape of the edge which may lead to defects being reduced or avoided. In an embodiment, the frequency is approximately less than or equal to approximately 500 kHz, or preferably less than or equal to approximately 100 kHz, or more preferably less than or equal to approximately 50 kHz. In an embodiment, the frequency is approximately greater than or equal to approximately 500 Hz, or preferably greater than or equal to approximately 1 kHz, or more preferably greater than or equal to approximately 10 kHz.

In an embodiment the frequency of oscillation of the plasma jet 145 is controlled so that the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the frequency of oscillation of the plasma jet 145 is controlled so that the typical wavelength is greater than or equal to approximately 10 µm, or preferably greater than or equal to approximately 50 µm, or more preferably greater than or equal to approximately 0.1 mm Controlling the frequency of oscillation to generate an edge with a wavelength with these values, in particular the preferable and more preferable values, may mean that the defects can be reduced or even avoided.

In an embodiment, the method comprises controlling the amplitude of oscillation of the plasma jet 145 within a predetermined range of amplitudes to control a radial width RW of the edge. Controlling the amplitudes of the plasma jet 145 within a predetermined range may control a radial width RW of the edge, i.e. the amplitude of oscillation can be altered to modulate/adjust the width of the edge in the radial direction. Therefore, the shape of the edge may be altered and controlled by controlling the amplitude of oscillation of the plasma jet 145. The resulting shape of the edge may allow the amplitude of oscillation of the plasma jet 145 to be controlled to reduce or even avoid defects.

In an embodiment the amplitude of oscillation of the plasma jet 145 is controlled so that the radial width RW is less than or equal to approximately 2 mm, or preferably less than or equal to approximately 0.5 mm, or more preferably less than or equal to approximately 0.3 mm. In an embodiment, the amplitude of oscillation of the plasma jet 145 is controlled so that the radial width RW is greater than or equal to approximately 10 µm, or preferably greater than or equal to approximately 50 µm, or more preferably greater than or equal to approximately 0.1 mm Controlling the amplitude of oscillation to generate an edge with a radial width RW with these values, in particular the preferable and more preferable values, may reduce or avoid defects as described.

In an embodiment, the amplitude of oscillation of the plasma jet 145 is approximately less than or equal to approximately 2 mm, or preferably less than or equal to approximately 0.5 mm, or more preferably less than or equal to approximately 0.3 mm. In an embodiment, the amplitude of oscillation of the plasma jet 145 is approximately greater than or equal to approximately 10 µm, or preferably greater than or equal to approximately 50 µm, or more preferably greater than or equal to approximately 0.1 mm.

In an embodiment, the method comprises oscillating the plasma jet 145 at a predetermined frequency. The method may further comprise rotating the substrate W at a first frequency and oscillating the plasma jet 145 at a second frequency. Rotating the substrate W at a first frequency may include providing the substrate W on a substrate support 7 and controlling rotation of the substrate support 7 around the axis of the substrate W. The method may comprise rotating the substrate W at hundreds or thousands of revolutions per minute. The second frequency may be higher than the first frequency. The second frequency may be significantly higher than the first frequency. In this context, significantly higher may mean that the second frequency is at least 10 times higher than the first frequency, or that the second frequency is at least 100 times higher than the first frequency, or that the second frequency is at least 1000 times higher than the first frequency.

Figure 15:
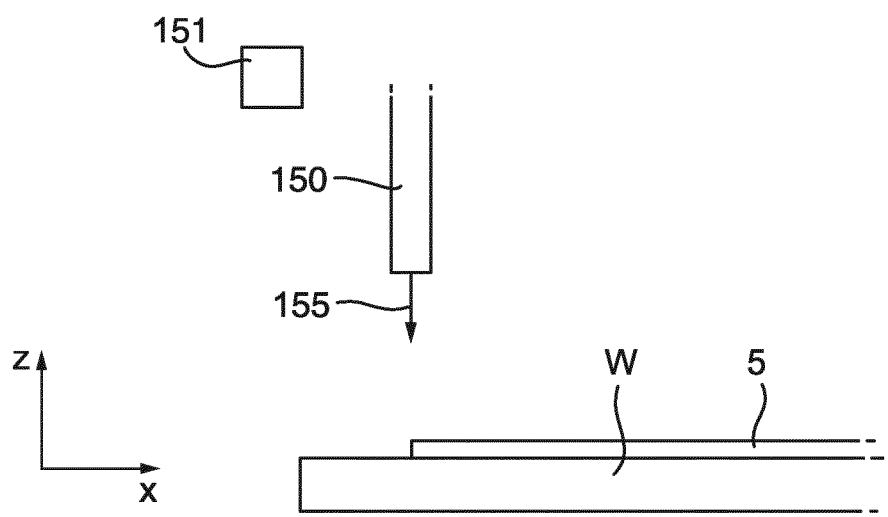
FIG. 15 is a schematic illustration of a side view of a portion of a substrate and a plasma device, according to an embodiment.

In any of the above embodiments relating to the use of a plasma device, the method may comprise pulsing a plasma device 150. This embodiment is depicted in FIG. 15. In other words, a plasma jet 155 from the plasma device 150 is incident on the substrate W and/or the layer of photosensitive material 5 in a pulsed manner, in that over a period of time, the plasma jet 155 is essentially in an "on" or "off" state. The "on" state being when the substrate W and/or the layer of photosensitive material 5 is exposed to the plasma jet 155 and the "off" state being when the substrate W and/or the layer of photosensitive material 5 is not exposed to the plasma jet 155. This may be controlled by providing a constant plasma jet 155 from the plasma device 150, but preventing the plasma jet 155 from reaching the surface of the substrate W and/or the layer of photosensitive material 5 during the "off" state periods. For example, a physical barrier may be used to prevent the substrate W and/or the layer of photosensitive material 5 being exposed to the plasma, such as a rotating disc with a hole to allow plasma to pass through.

The "on" state may be provided at any frequency which adequately generates the edge as described above. For example only, the frequency of the "on" state may be of the order of 1 Hz up to hundreds of kHzs, or even MHzs, for example, the frequency may be between approximately 10 kHz to 1 MHz, although this is not necessarily the case. The frequency may be varied depending on the relative movement between the plasma jet 155 and the substrate W and/or the layer of photosensitive material 5, the wavelength of the plasma jet 155 and the power of the plasma device 150. The frequency may be varied to obtain the edge as described above.

In this embodiment, the plasma jet 155 incident on the surface of the substrate W and/or the layer of photosensitive material 5 is moved relative to the surface of the substrate W and/or the layer of photosensitive material 5. For example, there may be relative movement between each pulse, or between a set number of pulses. In an embodiment, the plasma device 150 is moved relative to the substrate W. In this way, different pulses of the plasma jet 155 will be incident on different portions of the photosensitive material, thus removing different portions of the layer photosensitive material 5 and generating the edge.

In this embodiment, the method may comprise controlling the pulsing of the plasma jet 155 on the substrate W and/or the layer of photosensitive material 5 depending on at least one property of the photosensitive material. A controller 151 may be provided to control a movement of a physical barrier to control the pulses of the plasma jet 155 from the plasma device 150. The controller 151 may be the same as any of the controllers previously described. Although the controller 151 is shown as external to the plasma device 150, the controller 151 and/or the physical barrier may be integrated with the plasma device 150.

The pulses of the plasma jet 155 may be controlled to have a fixed "on" and "off" state. The pulses of the plasma jet 155 may be at regular intervals. The "on" and "off" states of the pulsed plasma jet 155 may be equivalent, i.e. the plasma jet 155 may be incident on the substrate W and/or the layer of photosensitive material 5 for the same amount of time as it is not incident on the substrate W and/or the layer of photosensitive material 5. In other words, the duty cycle may be 50%. The frequency of the pulses of the plasma jet 155 is the number of pulses repeating in a specific time unit. In other words, the frequency is the number of times the plasma jet 155 is turned to an "on" state in a specific time unit. The amount of time that the surface of the substrate W and/or the layer of photosensitive material 5 is exposed to the plasma jet 155 may depend on the power of the plasma device 150. For example, the plasma jet 155 may be in an "on" state for longer if the power of the plasma device 150 is reduced.

In an embodiment, controlling the frequency of pulses of the plasma jet 155 on the substrate W and/or the layer of photosensitive material 5 includes controlling the frequency within a predetermined range of frequencies. Controlling the frequency of pulses of the plasma jet 155 within a predetermined range may control a wavelength of the edge, i.e. the frequency can be altered to modulate/adjust the wavelength of the edge. The wavelength may be interpreted as described above for a rough edge or a patterned edge as applicable. Therefore, the shape of the edge may be altered and controlled by controlling the frequency of pulses of the plasma jet 155. This may allow the frequency of pulses to be controlled to shape the edge such that defects may be reduced or even avoided. In an embodiment, the frequency is approximately less than or equal to approximately 500 kHz, or preferably less than or equal to approximately 100 kHz, or more preferably less than or equal to approximately 50 kHz. In an embodiment, the frequency is approximately greater than or equal to approximately 500 Hz, or preferably greater than or equal to approximately 1 kHz, or more preferably greater than or equal to approximately 10 kHz.

In an embodiment the frequency of pulses of the plasma jet 155 on the substrate W and/or the layer of photosensitive material 5 is controlled so that the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the frequency of pulses of the plasma jet 155 on the substrate W and/or the layer of photosensitive material 5 is controlled so that the typical wavelength is greater than or equal to approximately 10 µm, or preferably greater than or equal to approximately 50 µm, or more preferably greater than or equal to approximately 0.1 mm Controlling frequency of pulses of the plasma jet 155 on the substrate W and/or the layer of photosensitive material 5 to generate an edge with a wavelength with these values, in particular the preferable and more preferable values, may mean that the defects can be reduced or even avoided.

In this embodiment, the method comprises pulsing the plasma jet 155 on the substrate W and/or the layer of photosensitive material 5 at a predetermined frequency. The method may further comprise rotating the substrate W at a first frequency and pulsing the plasma jet 155 at a second frequency. Rotating the substrate W at a first frequency may include providing the substrate W on a substrate support 7 and controlling rotation of the substrate support 7 around the axis of the substrate W. The method may comprise rotating the substrate W at hundreds or thousands of revolutions per minute. The second frequency may be higher than the first frequency. The second frequency may be significantly higher than the first frequency. In this context, significantly higher may mean that the second frequency is at least 10 times higher than the first frequency, or that the second frequency is at least 100 times higher than the first frequency, or that the second frequency is at least 1000 times higher than the first frequency.

In an embodiment, the method may comprise controlling the localisation (i.e. the width) of the plasma jet 155 from plasma device 150 incident on the substrate W and/or the layer of photosensitive material 5 within a predetermined range to control a radial width RW of the edge around the layer of photosensitive material 5 remaining on the surface of the substrate W. As described above, controlling the shape of the edge, e.g. the radial width RW of the edge, around the layer of photosensitive material 5 can affect defects on the surface of the substrate W and thus may be controlled to reduce errors described above. This may allow the width of the plasma jet 155 from plasma device 150 incident on the substrate W and/or the layer of photosensitive material 5 to be controlled to reduce or even avoid defects.

In an embodiment, the width of the plasma jet 155 from plasma device 150 incident on the substrate W and/or the layer of photosensitive material 5 is controlled so that the radial width RW of the edge is less than or equal to approximately 3 mm, or preferably less than or equal to approximately 2 mm, or more preferably less than or equal to approximately 0.5 mm. In an embodiment, the width of the plasma jet 155 from plasma device 150 incident on the substrate W and/or the layer of photosensitive material 5 is controlled so that the radial width RW of the edge is greater than or equal to approximately 0.01 mm, or preferably greater than or equal to approximately 0.05 mm, or more preferably greater than or equal to approximately 0.1 mm Controlling the width of the plasma jet 155 from plasma device 150 incident on the substrate W and/or the layer of photosensitive material 5 to generate an edge with a radial width RW with these values, in particular the preferable and more preferable values, may reduce or even avoid defects due to the edge of the remaining layer of the photosensitive material 5.

In an embodiment, an indication of the resulting defects and/or water loss on the substrate W may be provided. The indication of the resulting defects and/or water loss on the substrate W may be provided using the measurement unit 142 as described above, for example with the embodiments depicted in FIG. 14. However, in this embodiment, the measurement unit 142 may send control signals to, or receive control signals from, the controller 151. From using the indication received from the measurement unit 142 as described above, it may be determined that a change is required in the plasma jet 155 from the plasma device 150, for example, the frequency of the pulses and/or intensity of the plasma jet 155 etc. The controller 151 may be used to determine the change required and change the characteristic of the plasma jet 155. Alternatively, the controller 151 may receive input from measurement unit 142 indicating the change for controlling the plasma jet 155. An indication of the effect of the change on the resulting defects and/or water loss on the substrate W may be provided, for example using the measurement unit 142 described above, to determine if a further change is desirable.

The plasma jet 155 may be the same as plasma jet 145, and the plasma device 150 may be the same as plasma device 140. As such, the plasma device 140 used to provide an oscillating plasma jet 145 may also be used to provide a pulsed plasma jet 155. Therefore, the plasma jet 155 may be configured to oscillate and pulse, optionally at the same time.

In any of the above embodiments relating to a plasma jet (i.e. localised plasma), the method may further comprise providing a patterning device. In this embodiment, the patterning device may be used to in some way pattern the plasma jet incident on the substrate W and/or the layer of photosensitive material 5. In an embodiment, the plasma jet may pass through the patterning device.

In an embodiment, the patterning device may be moved relative to the substrate W to generate the edge as described above. For example, the patterning device may be moved around the outside of the substrate W in order to redirect the plasma jet. The patterning device may allow some but not all the plasma jet to be directed to the substrate W and/or or the layer of photosensitive material 5.

In an embodiment, relative movement of the patterning device may be controlled depending on at least one property of the photosensitive material. In an embodiment, the relative movement of the patterning device may be controlled so that the wavelength of the edge is within a desired range. The wavelength may be interpreted as described above for a rough edge or a patterned edge as applicable. In an embodiment, the typical wavelength is less than or equal to approximately 2 mm, or preferably less than or equal to approximately 0.5 mm, or more preferably less than or equal to approximately 0.3 mm. The typical wavelength may be the average wavelength. In an embodiment, the movement of the patterning device is controlled so that the typical wavelength is greater than or equal to approximately 10 µm, or preferably greater than or equal to approximately 50 µm, or more preferably greater than or equal to approximately 0.1 mm. Controlling the movement of the patterning device to generate an edge as described above with a wavelength with these values, in particular the preferable and more preferable values, may mean that defects can be reduced or even avoided.

Figure 16A:
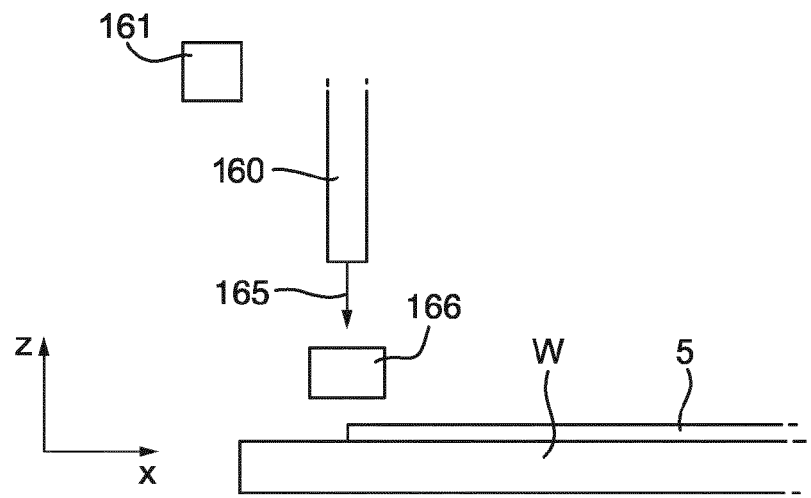
FIG. 16A is a schematic illustration of a side view of a portion of a substrate and a plasma device, according to an embodiment, wherein a patterning device is provided.
Figure 16B:
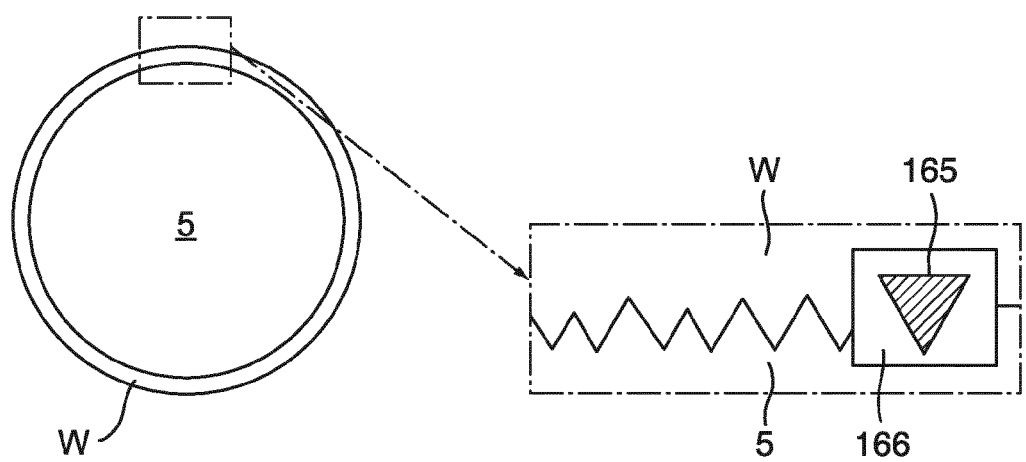
FIG. 16B is a schematic illustration of a plan view of the substrate and the patterning device.

In an embodiment, relative movement of the patterning device is controlled so that the radial width RW is less than or equal to approximately 2 mm, or preferably less than or equal to approximately 0.5 mm, or more preferably less than or equal to approximately 0.3 mm. In an embodiment, relative movement of the patterning device is controlled so that the radial width RW is greater than or equal to approximately 10 µm, or preferably greater than or equal to approximately 50 µm, or more preferably greater than or equal to approximately 0.1 mm Controlling the relative movement of the patterning device to generate an edge as described above with a radial width RW with these values, in particular the preferable and more preferable values, may reduce or avoid defects as described In an embodiment, the patterning device is a shaped mask 166. The shaped mask 166 is depicted in FIGS. 16A and 16B as a separate component, but could be part of the plasma device 160, thus defining the shape of the plasma jet 165 emitted by the plasma device 160. The shaped mask 166 may otherwise be referred to as a geometric mask. As shown in FIG. 16A, plasma device 160 emits plasma jet 165 to which the substrate W and/or the layer of photosensitive material 5 is exposed. The plasma jet 165 is directed to the substrate W and/or the layer of photosensitive material 5 and the shaped mask 166 prevents or reduces the plasma jet 165 being provided outside of a certain portion of the shaped mask 166 from reaching the substrate W and/or the layer of photosensitive material 5.

The shaped mask 166 may be a mask inserted into the cross section of the plasma jet 165, which, for example, prevents (or reduces) the plasma jet 165 reaching the substrate W and/or the layer of photosensitive material 5 except for through a particular shaped hole such that only the plasma jet 165 through the shaped hole would reach the substrate W. Generating the edge using a shaped mask 166 is depicted in FIGS. 16A and 16B. As shown the shaped mask 166 allows the plasma jet 165 to pass through it in the shape of a triangle in plan view, i.e. the plasma jet 165 is shaped by the shaped mask 166. The shaped mask 166 may be any desired shape to achieve a desired thickness profile around the edge. The shaped mask 166 may have a shaped hole with a pattern or repeated shape rather than a single shape as shown. The shaped mask 166 may have a shaped hole as described and the size of the hole is not particularly limiting. For example, the shaped hole may have a width in the order of 10 s, 100 s, or 1000 s µm.

Movement of the shaped mask 166 may be controlled using a controller 161. The controller 161 maybe the same type of same controller as described in any of the above embodiments. The plasma device 160 and plasma jet 165 may be the same as other plasma devices and plasma jets respectively as previously described. Thus, the shaped mask 166 may be provided in addition with the oscillating and/or pulsing plasma jet embodiments described above.

In any of the above embodiments relating to the use of a plasma device for generating the edge, the cross sectional area of the plasma jet incident on the substrate W and/or the layer of photosensitive material 5, e.g. the width of the plasma jet, may be controlled depending on at least one property of the photosensitive material. Controlling the plasma jet may alter the characteristics of the edge produced around the layer of photosensitive material 5 remaining on the surface of the substrate W. For example, the width and/or intensity of the plasma jet incident on the surface of the substrate W and/or the layer of photosensitive material 5 may alter the pitch and depth of the features of the edge, i.e. may alter the structure such that the edge has a desired structure. The structure may have circumferential and radial contact angle/height variations, e.g. due to patterning or roughness as described above. Thus, controlling the plasma jet can affect the properties of the edge and may thus be controlled to take into account of the effect of the edge, e.g. to take into account resulting defects and/or water loss on the substrate W in order to reduce or avoid defects occurring. In this way, controlling the plasma jet may be controlled based on some sort of feedback from at least one sensor and/or processor. In any of the above embodiments relating to the use of a plasma device, the position of the plasma device may be controlled to control the direction of the plasma jet as it reaches the substrate W. The position may be controlled to control which part of the layer of photosensitive material 5 that the plasma jet affects. The position may be controlled, for example, by tilting the plasma device to alter the direction of the plasma jet which slightly alters the shape of the plasma jet incident on the surface of the substrate W and/or the layer of photosensitive material 5.

Figure 17:
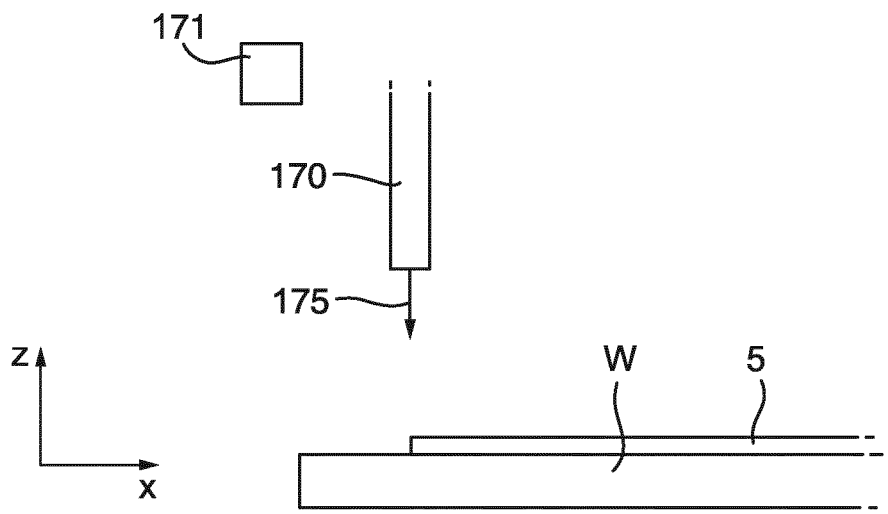
FIG. 17 is a schematic illustration of a side view of a portion of a substrate and a plasma device, according to an embodiment.

In the above embodiments using plasma, an alternative way to obtain surface roughness is to make use of erratically streaming plasma discharges. Rotating the substrate edge under this type of plasma will result in desired topography at the edge of the substrate W. Thus, for example, the plasma device in FIGS. 14-16B could be used to generate erratically streaming plasma discharges rather than a localised jet. FIG. 17 shows an erratic plasma device 170 for generating erratic plasma 175, i.e. which is irregular and does not provide the plasma discharge as a controlled jet described above. As depicted, a controller 171 may be used to control the erratic plasma device 170. The erratic plasma 175 may generate variation in the thickness profile along the edge due to the erratic nature of this type of plasma. Thus, a rough edge can be created using erratically streaming plasma and rotating the substrate W below the plasma device 170 without further control or patterning as described above for other embodiments.

In all cases, care should be taken not to damage the substrate W. This can be achieved by tuning the plasma properties and limiting the plasma discharge to the edge of the substrate W for removal of the edge bead. This also applies to the removal of the photosensitive material using other techniques, including for example, using the nozzle or laser described in any of the above embodiments.

In any of the above embodiments, the portion of the edge being removed may be processed several times. In other words, the same portion of the edge may pass under any of the above nozzles and/or lasers and/or plasma devices multiple times. In this way, the above described nozzles and/or lasers and/or plasma devices may be used on the same portion of the edge several times to achieve the desired thickness profile.

In any of the above embodiments relating to the laser beam or the plasma jet, the laser beam (or plasma jet) and substrate W may be moved relative to each other by mechanical means. For example, the substrate W may be moved relative to the radiation beam by a control system which displaces the substrate W as desired. Alternatively the position of the radiation beam may be moved by optical means. For example, one or more mirrors can be moved, for example, by means including at least one piezo actuator; or the mirrors can scan the radiation beam over the region of the substrate W and/or the layer of photosensitive material 5 as desired. Alternatively, the radiation beam could be coupled into an optical fibre and guided towards the substrate W, where the optical fibre, and optionally an associated optical focussing element and the substrate W can be moved relative to one another. The mechanical or optical systems may be combined in any appropriate manner in order to move the laser beam and the substrate W relative to one another.

In any of the above embodiments comprising an oscillating component, the method may be controlled more generally to oscillate the nozzle, the radiation beam, the laser and/or the plasma device relative to the substrate W (i.e. the nozzle, the radiation beam, the laser and/or the plasma device do not necessarily have to be oscillated). Thus, although each of the nozzle, the radiation beam, the laser and the plasma device are described as being capable of oscillating, these embodiments may have the same effect by ensuring relative movement equivalent to the movement already described. Thus, the substrate W may be moved as well or instead of the nozzle, the radiation beam, the laser and/or the plasma device respectively. For example, the substrate support 7 may be controlled by a controller 12 depicted in FIG. 1 which may move the substrate W. Thus, the substrate W can be controlled to oscillate which can provide the same relative movement to the nozzle, the radiation beam, the laser and/or the plasma device described above.

As described above and shown in FIG. 1, the substrate W can be supported by a substrate support 7. The substrate support 7 may be used to control movement of the substrate W as necessary. As the substrate W may rotate whilst the photosensitive material is removed from around an outer edge of the layer of the photosensitive material, the rotation of the substrate W may be controlled, for example at a first frequency. Thus, in any of the above embodiments, the substrate support 7 can be controlled to control the circumferential speed at the edge of the substrate W. The substrate support 7 may be controlled by a support controller 12 depicted in FIG. 1.

The substrate support 7 may be configured to rotate the substrate W at a frequency such that the circumferential speed at the edge of the substrate W is less than or equal to approximately 12 m/s. Preferably, the substrate W is rotated at a speed which has a lower circumferential speed, preferably less than or equal to 10 m/s, or less than or equal to 8 m/s or preferably even lower. Thus, more generally, in any of the embodiments, method may further comprise rotating the substrate W to have a circumferential speed at the edge of the substrate W which is less than or equal to approximately 12 m/s, preferably less than or equal to 10 m/s, or more preferably less than or equal to 8 m/s. For example, for a substrate W which is 300 mm in diameter, this equates to rotating the substrate W at approximately less than or equal approximately 750 rpm, less than or equal to approximately 650 rpm, less than or equal to approximately 500 rpm or even lower respectively. If the diameter of the substrate W is larger, then a lower spin speed (i.e. lower rpm) may be required to achieve a preferred circumferential speed at the edge of the substrate W. Thus, the preferred rpm of the substrate W will depend on the size of the substrate W, i.e. the substrate W diameter.

Thus, the relative speed between the substrate W from which the photosensitive material is removed and the component doing the removing, e.g. using any of the nozzles, lasers or plasma devices (described above) can be controlled. Reducing the rotational speed of the substrate W as described above, has the advantage that the film puling can be reduced. The reduction of speed of the substrate W provides variation in the thickness profile along the length of the edge of photosensitive material, thus providing increased roughness along the edge of the layer of photosensitive material 5. By reducing the rotational speed of the substrate W, the rough edge described above can be achieved which has the same advantageous effects already described, for example improving film pulling. There is no lower limit on the rotational speed of the substrate W. However, in general it is preferable to process the substrate W as quickly as possible in order to produce as many substrates W as possible within a given time period. Thus, the speed at which the substrate W is rotated is a compromise between maintaining adequate processing time and decreasing the speed of the rotation of the substrate W to provide the advantages described above.

As well as controlling the rotational speed of the substrate W in accordance with components described above to produce a rough edge, previously known methods for removing photosensitive material from around an outer edge of a layer of photosensitive material 5 may be used and the rotational speed of the substrate W may be reduced to generate variation in the thickness profile along the edge. In other words, for example, conventional nozzles may be used and the rotational speed of the substrate W may be reduced to the values described above such that the removing is controlled by varying of the speed of the substrate W relative to the nozzle so as to generate variation in the thickness profile along the length of the edge. In this way, the edge can be generated as a rough edge, due to the reduced speed of rotating the substrate W, even using previously known edge removal techniques.

Figure 18:
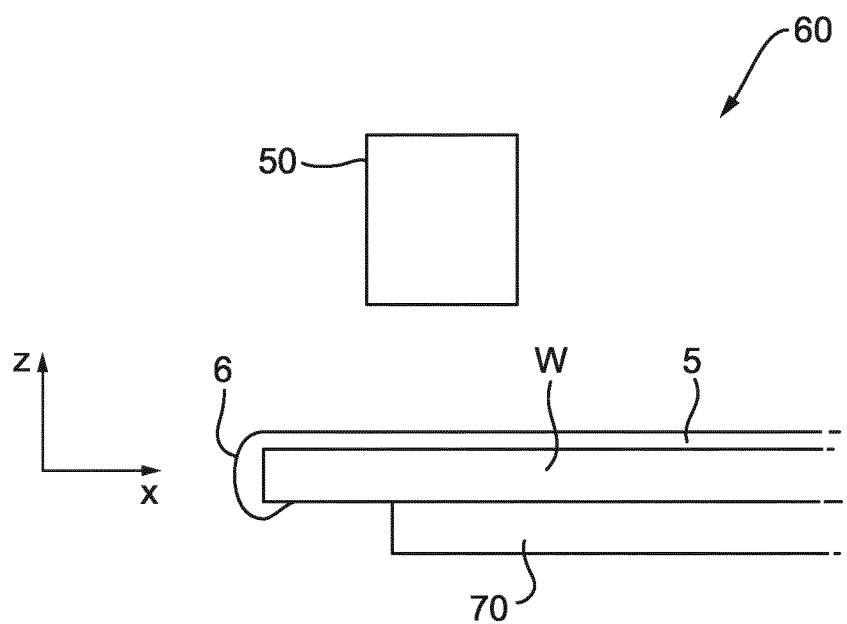
FIG. 18 is a schematic illustration of an apparatus according to an embodiment.

In an embodiment an apparatus 60 for processing a substrate W may be provided. The apparatus 60 is depicted in FIG. 18. The apparatus 60 may be provided to carry out the method described in any of the above embodiments. In more detail, an apparatus 60 for processing a substrate W may be provided comprising a substrate support system 70 configured to support a substrate W comprising a layer of photosensitive material 5 on a surface of the substrate W and a substrate edge processing unit 50 configured to remove photosensitive material from around an outer edge of the layer of photosensitive material 5. The substrate edge processing unit 50 is configured to generate an edge, having a radial width RW, around the layer of photosensitive material 5 remaining on the surface of the substrate W when removing the photosensitive material. The photosensitive material varies in thickness forming a thickness profile across the radial width RW. The removing can be controlled so as to generate variation in the thickness profile along the length of the edge. The removing can be controlled to generate a rough edge, which may have variation in the thickness profile along the length of the edge as above, or alternatively, with a uniform thickness profile along the length of the edge. The substrate support system 70 may comprise the substrate support 7 as described above.

In an embodiment, the substrate edge processing unit 50 is configured to generate a rough edge. As described, the rough edge may be uniform or non-uniform in the circumferential direction, i.e. along the length of the edge. In this embodiment, the substrate edge processing unit 50 may comprise a nozzle 10 configured to spray a solvent 15 on the layer of photosensitive material 5 around the outer edge of the layer of photosensitive material 5 and the nozzle 10 may be configured to oscillate when spraying the solvent 15 so as to generate the rough edge. Alternatively, in this embodiment, the substrate edge processing unit 50 being configured to remove photosensitive material includes that the substrate edge processing unit 50 is configured to remove only some photosensitive material from around the outer edge of the layer of photosensitive material 5 and the substrate edge processing unit 50 comprises a nozzle 20 configured to spray droplets of a solvent 25 to remove further photosensitive material from the around the remaining layer of photosensitive material 5 so as to generate the rough edge.

In an embodiment, the substrate edge processing unit 50 is configured to generate a patterned edge.

In an embodiment, the substrate edge processing unit 50 comprises a laser (for example, any of lasers 90, 100, 110, 120 and/or 130) configured to direct radiation (e.g. radiation beam 95, 105, 115, 125 and/or 135) on the layer of photosensitive material 5 around the outer edge of the layer of photosensitive material 5 so as to generate the edge with variation in the thickness profile along the length of the edge and/or the rough edge. Using the laser may provide a rough or patterned edge as described above with variation in the thickness profile along the length of the edge. In this embodiment, the laser 90 may be configured to oscillate when directing radiation on the layer of photosensitive material 5. In this embodiment, the laser 100 may be configured to pulse when directing radiation on the layer of photosensitive material 5. In this embodiment, the apparatus may further comprise a patterning device and the substrate edge processing unit 50 is configured to direct the radiation on or through the patterning device. In this embodiment, the patterning device may comprise a transmissive or reflective patterned mask 116, a transmissive diffraction grating 126 and/or a reflective diffraction grating 136.

In an embodiment, the substrate edge processing unit 50 comprises a plasma device (for example, any of plasma devices 140, 150, 160 and/or 170) configured to direct plasma jet (e.g. plasma jet 145, 155, 165 and/or 175) on the layer of photosensitive material 5 around the outer edge of the layer of photosensitive material 5 so as to generate the edge with variation in the thickness profile along the length of the edge and/or the rough edge. Using the plasma device may provide a rough or patterned edge as described above with variation in the thickness profile along the length of the edge. In this embodiment, the plasma device 140 may be configured to oscillate when directing the plasma jet 145 on the layer of photosensitive material 5. In this embodiment, the plasma device 150 may be configured to pulse when directing the plasma jet 155 on the layer of photosensitive material 5. In this embodiment, the apparatus may further comprise a patterning device 166 and the substrate edge processing unit 50 is configured to direct the plasma jet 165 through the patterning device 166.

The apparatus 60 may further comprise any of the controllers (11, 21, 91, 101, 111, 121, 131, 141, 151, 161 and/or 171) as described above. The apparatus 60 may further comprise or communicate with the measurement unit 80, 92, 142 described above for use with the edge processing unit.

In any of the above embodiments, the substrate W may comprise layers (or one layer) of material on the surface of the substrate W on top of which the layer of photosensitive material 5 is located. Such layers of material can be part of the substrate W as it is being formed or a coating, which is optionally temporary, on the substrate W. These layers of material would be considered to be part of the substrate W as described in any of the above embodiments.

In any of the above embodiments, the edge having variation in the thickness profile along the length of the edge may not be generated around the entire edge of the remaining layer of photosensitive material 5, e.g. the whole circumference around the edge of the layer of photosensitive material 5 may not have variation in the thickness profile along the edge. For example, it may be beneficial to generate the edge having variation in the thickness profile along the length of the edge in specific or predetermined locations around the circumference of the remaining layer of photosensitive material 5. For example, the edge having variation in the thickness profile along the length of the edge may only be provided in locations around the edge where the liquid confinement structure IH passes over edge of layer of photosensitive material 5. The same applies to the rough edge which may be uniform along the length of the edge, but may only be applied to certain portions around the edge.

In an embodiment, this may be controlled by continuously oscillating the oscillating nozzle 10 over predetermined portions of remaining layer of photosensitive material 5, and not oscillating the oscillating nozzle 10 over other portions of the remaining layer of photosensitive material 5. In an embodiment, this may be controlled by spraying solvent 15, 25 from oscillating nozzle 10 and/or nozzle 20 respectively over predetermined portions of the remaining layer of photosensitive material 5, and not spraying solvent 15, 25 from oscillating nozzle 10 and/or nozzle 20 respectively over other portions of the remaining layer of photosensitive material 5. In an embodiment, this may be controlled by oscillating the radiation beam 95 from the laser 90 over predetermined portions of remaining layer of photosensitive material 5, and not oscillating the radiation beam 95 over other portions of the remaining layer of photosensitive material 5. In an embodiment, this may be controlled by allowing a radiation beam (95, 105, 115, 125, 135) from any of the lasers described above (90, 100, 110, 120, 130 respectively) to be incident on the substrate W over predetermined portions of the remaining layer of photosensitive material 5, and not allowing a radiation beam (95, 105, 115, 125, 135) over other portions of the remaining layer of photosensitive material 5. In an embodiment, this may be controlled by allowing a plasma jet (145, 155, 165, 175) from any of the plasma devices described above (140, 150, 160, 170 respectively) to be incident on the substrate W over predetermined portions of the remaining layer of photosensitive material 5, and not allowing the plasma jet (145, 155, 165, 175) over other portions of the remaining layer of photosensitive material 5.

The apparatuses as herein described may be used in a lithographic apparatus. The substrate W resulting from any of the above methods may be used in a lithographic apparatus.

The lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate W referred to herein may also be processed, before or after exposure, in for example a track (a tool that typically applies a layer of photosensitive material 5 to a substrate W and develops the exposed photosensitive material), a metrology tool and/or an inspection tool. Where applicable, the disclosure herein may be applied to such and other substrate processing tools. Further, the substrate W may be processed more than once, for example in order to create a multi-layer IC, so that the term substrate W used herein may also refer to a substrate W that already contains multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography a topography in a device for forming a pattern defines the pattern created on a substrate W. The topography of the device for forming a pattern may be pressed into a layer of photosensitive material 5 supplied to the substrate W whereupon the photosensitive material is cured by applying electromagnetic radiation, heat, pressure or a combination thereof. The device for forming a pattern is moved out of the photosensitive material leaving a pattern in it after the photosensitive material is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate W itself may be patterned and materials added on top of it may also be patterned, or may remain without patterning.

While specific embodiments have been described above, it will be appreciated that the embodiments may be practiced otherwise than as described. The description is not intended to limit the invention.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments as contemplated by the inventor(s), and thus, are not intended to limit the present invention and the appended claims in any way.

The embodiments have described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

Clauses representing arrangements of a lithographic apparatus according to embodiments are listed below.

Clause 1. A method of processing a substrate comprising:
providing a substrate with a layer of photosensitive material on a surface of the substrate; and
removing photosensitive material from around an outer edge of the layer of photosensitive material, and controlling the removing so as to generate an edge, having a radial width, around the layer of photosensitive material remaining on the surface of the substrate, wherein the photosensitive material varies in thickness forming a thickness profile across the radial width and the removing is controlled so as to generate variation in the thickness profile along the length of the edge.

Clause 2. The method according to clause 1, wherein the edge is a rough edge.

Clause 3. The method according to clause 2, wherein removing the photosensitive material from around the outer edge of the layer of photosensitive material comprises spraying a solvent on the layer of photosensitive material around the outer edge of the layer of photosensitive material using a nozzle, and oscillating the nozzle when spraying the solvent so as to generate the rough edge.

Clause 4. The method according to clause 3, further comprising rotating the substrate at a first frequency, and oscillating the nozzle at a second frequency, the second frequency being significantly higher than the first frequency.

Clause 5. The method according to clause 3 or 4, wherein the nozzle oscillates in a substantially radial direction.

Clause 6. The method according to any one of clauses 3 to 5, comprising controlling the frequency and/or amplitude of oscillation of the nozzle depending on at least one property of the photosensitive material.

Clause 7. The method according to any one of clauses 3 to 6, comprising controlling frequency of oscillation of the nozzle within a predetermined range of frequencies to control a wavelength of the rough edge.

Clause 8. The method according to clause 7, wherein the predetermined range of frequencies is approximately 500 Hz to 500 kHz, or preferably the predetermined range of frequencies is approximately 1 kHz to 100 kHz, or more preferably, the predetermined range of frequencies is approximately 10 kHz to 50 kHz.

Clause 9. The method according to clause 7 or 8, wherein the frequency of oscillation of the nozzle is controlled so that the wavelength is between approximately 10 µm to 2 mm, or preferably between approximately 50 µm to 0.5 mm, or more preferably between approximately 0.1 mm to 0.3 mm.

Clause 10. The method according to any one of clauses 3 to 9, comprising controlling amplitude of oscillation of the nozzle within a predetermined range of amplitudes to control the radial width of the rough edge.

Clause 11. The method according to clause 10, wherein the predetermined range of amplitudes is controlled so that the radial width is between approximately 10 µm to 2 mm, or preferably between approximately 50 µm to 0.5 mm, or more preferably between approximately 0.1 mm µm to 0.3 mm.

Clause 12. The method according to any one of clauses 3 to 11, wherein the nozzle is an edge removal nozzle.

Clause 13. The method according to clause 2, wherein the removing comprises an initial removal step for removing photosensitive material around the outer edge of the layer of photosensitive material, and further comprises spraying a solvent from a nozzle to remove further photosensitive material from around the remaining layer of photosensitive material so as to generate the rough edge.

Clause 14. The method according to clause 13, comprising controlling the width of the spray of solvent from the nozzle within a predetermined range to control a radial width of the rough edge around the layer of photosensitive material remaining on the surface of the substrate.

Clause 15. The method according to clause 14, wherein the predetermined range of the width of the spray of solvent from the nozzle on the substrate is controlled so that the radial width is between approximately 0.01 mm to 3 mm, or preferably between approximately 0.05 mm to 2 mm, or more preferably between approximately 0.1 mm to 0.5 mm.

Clause 16. The method according to any one of clauses 13 to 15, further comprising providing a barrier to protect part of the layer of photosensitive material from the solvent being sprayed by the nozzle.

Clause 17. The method according to clause 16, wherein the barrier comprises a physical element.

Clause 18. The method according to clause 16, wherein the barrier comprises a fluid jet, wherein the fluid used for the fluid jet is not a solvent for the photosensitive material.

Clause 19. The method according to any one of clauses 13 to 18, wherein the step of spraying comprises spraying droplets of solvent.

Clause 20. The method according to any one of clauses 13 to 18, wherein the step of spraying comprises spraying aerosol comprising droplets of solvent.

Clause 21. The method according to clause 19 or 20, comprising controlling the average diameter of the droplets of solvent from the nozzle within a predetermined range of average diameters to control the roughness edge around the outer edge of the layer of photosensitive material remaining on the surface of the substrate.

Clause 22. The method according to clause 21, wherein the predetermined range of the average diameter of the droplets of solvent from the nozzle is between approximately 1 micron to 0.2 mm, or preferably between approximately 5 µm to 50 µm, or more preferably between approximately 10 µm to 30 µm.

Clause 23. The method according to any one of clauses 3 to 22, wherein the nozzle is a sonic or an ultrasonic nozzle.

Clause 24. The method according to clause 1, wherein the edge is a patterned edge.

Clause 25. The method according to clause 24, wherein the patterned edge has a substantially uniform pattern along the length of the edge, preferably wherein the pattern is a sinusoidal wave, triangular wave, square wave or a rectangular wave along the length of the edge.

Clause 26. The method according to any one of clauses 1, 2, 24 and 25, wherein removing the photosensitive material from around the outer edge of the layer of photosensitive material comprises directing radiation from a laser to be incident on the photosensitive material around the outer edge of the layer of photosensitive material.

Clause 27. The method according to any one of clauses 1, 2, 24 and 25, wherein the removing comprises an initial removal step for removing photosensitive material around the outer edge of the layer of photosensitive material, and further comprises directing radiation from a laser to be incident on the photosensitive material to remove further photosensitive material from around the remaining layer of photosensitive material so as to generate the edge.

Clause 28. The method according to clause 26 or 27, further comprising oscillating the incidence of the radiation on the photosensitive material so as to generate the edge.

Clause 29. The method according to clause 28, further comprising rotating the substrate at a first frequency, and oscillating the incidence of the radiation on the photosensitive material at a second frequency, the second frequency being significantly higher than the first frequency.

Clause 30. The method according to clause 28 or 29, wherein the incidence of the radiation on the photosensitive material oscillates in a substantially radial direction.

Clause 31. The method according to any one of clauses 28 to 30, comprising controlling the frequency and/or amplitude of oscillation of the incidence of the radiation on the photosensitive material depending on at least one property of the photosensitive material.

Clause 32. The method according to any one of clauses 28 to 31, comprising controlling frequency of oscillation of the incidence of the radiation on the photosensitive material within a predetermined range of frequencies to control a wavelength of the edge.

Clause 33. The method according to clause 32, wherein the predetermined range of frequencies is approximately 500 Hz to 500 kHz, or preferably the predetermined range of frequencies is approximately 1 kHz to 100 kHz, or more preferably, the predetermined range of frequencies is approximately 10 kHz to 50 kHz.

Clause 34. The method according to clause 32 or 33, wherein the frequency of oscillation of the incidence of the radiation on the photosensitive material is controlled so that the wavelength is between approximately 10 µm to 2 mm, or preferably between approximately 50 µm to 0.5 mm, or more preferably between approximately 0.1 mm to 0.3 mm.

Clause 35. The method according to any one of clauses 28 to 34, comprising controlling amplitude of oscillation of the incidence of the radiation on the photosensitive material within a predetermined range of amplitudes to control the radial width of the edge.

Clause 36. The method according to clause 35, wherein the predetermined range of amplitudes is controlled so that the radial width is between approximately 10 µm to 2 mm, or preferably between approximately 50 µm to 0.5 mm, or more preferably between approximately 0.1 mm µm to 0.3 mm.

Clause 37. The method according to any one of clause 26 to 36, wherein the method further comprises pulsing the radiation beam from the laser, and the pulsed radiation beam incident on incident on the photosensitive material is moved relative to the photosensitive material so as to generate the edge.

Clause 38. The method according to clause 37, further comprising rotating the substrate at a first frequency, and pulsing the laser at a second frequency, the second frequency being significantly higher than the first frequency.

Clause 39. The method according to clause 37, further comprising controlling the frequency of pulses of the laser depending on at least one property of the photosensitive material.

Clause 40. The method according to clause 37 or 38, comprising controlling frequency of pulses of the laser within a predetermined range of frequencies to control a wavelength of the edge.

Clause 41. The method according to clause 39, wherein the predetermined range of frequencies is approximately 500 Hz to 500 kHz, or preferably the predetermined range of frequencies is approximately 1 kHz to 100 kHz, or more preferably, the predetermined range of frequencies is approximately 10 kHz to 50 kHz.

Clause 42. The method according to clause 39 or 40, wherein the frequency of pulses of the laser is controlled so that the wavelength is between approximately 10 µm to 2 mm, or preferably between approximately 50 µm to 0.5 mm, or more preferably between approximately 0.1 mm to 0.3 mm.

Clause 43. The method according to clause 41, wherein the pulses of the laser are controlled so that the radial width is between approximately 10 µm to 2 mm, or preferably between approximately 50 µm to 0.5 mm, or more preferably between approximately 0.1 mm µm to 0.3 mm.

Clause 44. The method according to clause 26 or 27, further comprising providing a patterning device and directing the radiation to reflect from or pass through the patterning device so as to generate the edge.

Clause 45. The method according to clause 43, further comprising moving the patterning device relative to the substrate to generate the edge.

Clause 46. The method according to either one of clauses 43 or 44, wherein relative movement of the patterning device is controlled depending on at least one property of the photosensitive material.

Clause 47. The method according to any one of clauses 43 to 45, wherein relative movement of the patterning device is controlled so that the wavelength of the edge is between approximately 10 µm to 2 mm, or preferably between approximately 50 µm to 0.5 mm, or more preferably between approximately 0.1 mm to 0.3 mm.

Clause 48. The method according to any one of clauses 43 to 46, wherein relative movement of the patterning device is controlled to control the radial width of the edge, and the radial width is between approximately 10 µm to 2 mm, or preferably between approximately 50 µm to 0.5 mm, or more preferably between approximately 0.1 mm µm to 0.3 mm.

Clause 49. The method according to any one of clauses 43 to 47, wherein the patterning device comprises a transmissive patterned mask, a reflective patterned mask or a shaped mask.

Clause 50. The method according to any one of clauses 43 to 47, wherein the patterning device comprises a transmissive diffraction grating.

Clause 51. The method according to clause 49, wherein the transmissive diffraction grating comprises at least one surface with multiple slits having a predetermined distance between the slits, and the predetermined distance is selected depending on at least one property of the photosensitive material.

Clause 52. The method according to any one of clauses 43 to 47, wherein the patterning device comprises a reflective diffraction grating.

Clause 53. The method according to clause 51, wherein the reflective diffraction grating comprises at least one surface with multiple grooves having a predetermined distance between the grooves, and the predetermined distance is selected depending on at least one property of the photosensitive material.

Clause 54. The method according to any one of clauses 26 to 52, wherein the cross-sectional area of radiation incident on the photosensitive material is controlled so that the radial width of the edge is between approximately 10 µm to 2 mm, or preferably between approximately 50 μm to 0.5 mm, or more preferably between approximately 0.1 mm μm to 0.3 mm.

Clause 55. An apparatus for processing a substrate comprising:
a substrate support system configured to support a substrate, the substrate comprising a layer of photosensitive material on a surface thereof; and
a substrate edge processing unit being configured to remove photosensitive material from around an outer edge of the layer of photosensitive material, wherein the substrate edge processing unit is configured to control the removing so as to generate an edge, having a radial width, around the layer of photosensitive material remaining on the surface of the substrate, wherein the photosensitive material varies in thickness forming a thickness profile across the radial width and the substrate edge processing unit is configured to control the removing so as to control variation in the thickness profile along the length of the edge.

Clause 56. The apparatus according to clause 55, wherein the substrate edge processing unit is configured to generate a rough edge.

Clause 57. The apparatus according to clause 56, comprising a nozzle configured to spray a solvent on the layer of photosensitive material around the outer edge of the layer of photosensitive material, and the nozzle is configured to oscillate when spraying the solvent so as to generate the rough edge.

Clause 58. The apparatus according to clause 56, wherein the substrate edge processing unit being configured to remove photosensitive material includes that the substrate edge processing unit is configured to remove at least some photosensitive material from around the outer edge of the layer of photosensitive material, and the substrate edge processing unit comprises a nozzle configured to spray droplets of a solvent to remove further photosensitive material from around the remaining layer of photosensitive material so as to generate the rough edge.

Clause 59. The apparatus according to clause 55, wherein the substrate edge processing unit is configured to generate a patterned edge.

Clause 60. The apparatus according to any one of clauses 55, 56 and 59, wherein the substrate edge processing unit comprises a laser configured to direct radiation on the layer of photosensitive material around the outer edge of the layer of photosensitive material so as to generate the edge.

Clause 61. The apparatus according to clause 60, wherein and the laser is configured to oscillate when directing radiation on the layer of photosensitive material.

Clause 62. The apparatus according to clause 60, wherein and the laser is configured to pulse when directing radiation on the layer of photosensitive material.

Clause 63. The apparatus according to clause 60, further comprising a patterning device and the substrate edge processing unit being configured to direct the radiation on or through the patterning device.

Clause 64. The apparatus according to clause 63, wherein the patterning device is a transmissive or reflective patterned mask.

Clause 65. The apparatus according to clause 63, wherein the patterning device is a transmissive diffraction grating.

Clause 66. The apparatus according to clause 63, wherein the patterning device is a reflective diffraction grating.

Clause 67. A lithographic apparatus comprising the apparatus of any one of clauses 55 to 66.

The invention claimed is:

1. A method of processing a substrate, the method comprising:
providing a substrate with a layer of photosensitive material on a surface of the substrate;
removing at least part of the photosensitive material from the layer of photosensitive material so as to generate an edge around the layer of photosensitive material remaining on the surface of the substrate, the edge having a radial width,
wherein the photosensitive material remaining on the surface of the substrate varies in thickness across the radial width of the edge so as to have a thickness profile, and
wherein the removing is controlled so as to generate variation in the thickness profile along at least part of the length of the periphery of the edge.

2. The method according to claim 1, wherein the edge is a rough edge.

3. The method according to claim 2, wherein the removing the at least part of the photosensitive material comprises spraying a fluid on the layer of photosensitive material around the outer edge of the layer of photosensitive material using a nozzle, and oscillating the nozzle and/or the substrate when spraying the fluid so as to generate the rough edge.

4. The method according to claim 2, wherein the removing the at least part of the photosensitive material comprises:
an initial removal step of removing photosensitive material around the outer edge of the layer of photosensitive material, and a subsequent removal step of spraying a fluid from a nozzle, while oscillating the nozzle and/or the substrate, to remove further photosensitive material from around the remaining layer of photosensitive material so as to generate the rough edge.

5. The method according to claim 1, wherein the edge is a patterned edge.

6. The method according to claim 1, wherein the removing the at least part of the photosensitive material comprises directing radiation from a laser to be incident on the photosensitive material around the outer edge of the layer of photosensitive material.

7. The method according to claim 6, further comprising oscillating the incidence of the radiation on the photosensitive material so as to generate the edge.

8. The method according to claim 6, further comprising directing the radiation to reflect from or pass through a patterning device so as to generate the edge.

9. The method according to claim 6, further comprising pulsing the radiation beam from the laser, and providing relative movement between the photosensitive material and the pulsed radiation incident on the photosensitive material so as to generate the edge.

10. The method according to claim 1, wherein the removing the at least part of the photosensitive material comprises:
an initial removal step of removing photosensitive material around the outer edge of the layer of photosensitive material, and a subsequent removal step of directing radiation from a laser to be incident on the photosensitive material to remove further photosensitive material from around the remaining layer of photosensitive material so as to generate the edge.

11. The method according to claim 1, wherein the removing the at least part of the photosensitive material comprises exposing the photosensitive material around the outer edge of the layer of photosensitive material to a plasma.

12. The method according to claim 1, wherein the removing the at least part of the photosensitive material comprises:
an initial removal step of removing photosensitive material around the outer edge of the layer of photosensitive material, and a subsequent removal step of exposing the photosensitive material to a plasma to remove further photosensitive material from around the remaining layer of photosensitive material so as to generate the edge.

13. The method according to claim 1, further comprising rotating the substrate to have a circumferential speed at the edge of the substrate which is less than or equal to approximately 12 m/s.

14. A method of processing a substrate, the method comprising:
providing a substrate with a layer of photosensitive material on a surface of the substrate; and
removing at least part of the photosensitive material from the layer of photosensitive material so as to generate a rough edge around the layer of photosensitive material remaining on the surface of the substrate, the rough edge having a protrusion with an apex at a distance from the surface of the substrate less than an average thickness of the remaining photosensitive material inward of the rough edge.

15. The method according to claim 14, wherein the removing the at least part of the photosensitive material comprises directing radiation from a laser to be incident on the photosensitive material around the outer edge of the layer of photosensitive material.

16. The method according to claim 14, wherein the removing the at least part of the photosensitive material comprises exposing the photosensitive material around the outer edge of the layer of photosensitive material to a plasma.

17. The method according to claim 14, further comprising rotating the substrate to have a circumferential speed at the edge of the substrate which is less than or equal to approximately 12 m/s.

18. The method according to claim 14, wherein the removing the at least part of the photosensitive material comprises spraying a fluid on the layer of photosensitive material around the outer edge of the layer of photosensitive material using a nozzle, and oscillating the nozzle and/or the substrate when spraying the fluid so as to generate the rough edge.

19. An apparatus for processing a substrate, the apparatus comprising:
a substrate support system configured to support a substrate, the substrate comprising a layer of photosensitive material on a surface thereof; and
a substrate edge processing unit configured to remove photosensitive material from around an outer edge of the layer of photosensitive material,
wherein the substrate edge processing unit is configured to control the removing of the photosensitive material so as to generate an edge around the layer of photosensitive material remaining on the surface of the substrate, the edge having a radial width,
wherein the photosensitive material remaining on the surface of the substrate varies in thickness across the radial width of the edge so as to have a thickness profile, and
wherein the substrate edge processing unit is configured to control the removing so as to control variation in the thickness profile along at least part of the length of the periphery of the edge and configured to control the variation in the thickness profile by supply of radiation, plasma or fluid from an outlet located above the substrate.

20. An apparatus for processing a substrate, the apparatus comprising:
a substrate support system configured to support a substrate, the substrate comprising a layer of photosensitive material on a surface thereof; and
a substrate edge processing unit configured to remove photosensitive material from around an outer edge of the layer of photosensitive material,
wherein the substrate edge processing unit is configured to control the removing of the photosensitive material so as to generate a rough edge around the layer of photosensitive material remaining on the surface of the substrate, the rough edge having a protrusion with an apex at a distance from the surface of the substrate less than an average thickness of the remaining photosensitive material inward of the rough edge.

* * * * *